United States Patent
Min et al.

(10) Patent No.: US 12,046,625 B2
(45) Date of Patent: Jul. 23, 2024

(54) LIGHT EMITTING ELEMENT, MANUFACTURING METHOD THEREOF, AND DISPLAY DEVICE INCLUDING THE LIGHT EMITTING ELEMENT

(71) Applicant: Samsung Display Co., Ltd., Yongin-si (KR)

(72) Inventors: Jung Hong Min, Pyeongtaek-si (KR); Dae Hyun Kim, Hwaseong-si (KR); Hyun Min Cho, Seoul (KR); Dong Uk Kim, Hwaseong-si (KR); Dong Eon Lee, Hwaseong-si (KR); Seung A Lee, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 581 days.

(21) Appl. No.: 17/265,799

(22) PCT Filed: Jan. 14, 2019

(86) PCT No.: PCT/KR2019/000537
§ 371 (c)(1),
(2) Date: Feb. 3, 2021

(87) PCT Pub. No.: WO2020/027397
PCT Pub. Date: Feb. 6, 2020

(65) Prior Publication Data
US 2021/0167124 A1     Jun. 3, 2021

(30) Foreign Application Priority Data

Aug. 3, 2018 (KR) .................. 10-2018-0090544

(51) Int. Cl.
*H01L 33/12* (2010.01)
*H01L 27/15* (2006.01)
(Continued)

(52) U.S. Cl.
CPC ........ *H01L 27/156* (2013.01); *H01L 33/0095* (2013.01); *H01L 33/12* (2013.01);
(Continued)

(58) Field of Classification Search
CPC .................................................. H01L 33/0093
See application file for complete search history.

(56) References Cited

U.S. PATENT DOCUMENTS

2005/0074393 A1    4/2005   Wu et al.
2010/0320445 A1*  12/2010   Ogihara ............. H01L 29/2003
                                                               977/734
(Continued)

FOREIGN PATENT DOCUMENTS

EP      3270424 A1      1/2018
JP      2011-009268 A   1/2011
(Continued)

OTHER PUBLICATIONS

Querghi A. et al., "Epitaxial graphene on 3C-SiC(111) pseudosubstrate: Structural and electronic properties", Physical Review B 82(12), 125445-1-125445-6 (2010); DOI: 10.1103/PhysRevB.82.125445 (6 pages).

(Continued)

*Primary Examiner* — Moazzam Hossain
*Assistant Examiner* — Hajar Kolahdouzan
(74) *Attorney, Agent, or Firm* — Lewis Roca Rothgerber Christie LLP

(57) ABSTRACT

Provided are a light-emitting element, a manufacturing method thereof, and a display device comprising the light-emitting element. The method for manufacturing the light-emitting element comprises the steps of: preparing a lower substrate including a substrate and a buffer material layer formed on the substrate, forming a separating layer disposed on the lower substrate and including at least one graphene (Continued)

layer, forming an element deposition structure by depositing a first conductivity type semiconductor layer, an active material layer, and a second conductivity type semiconductor layer on the separating layer, forming an element rod by etching the element deposition structure and the separating layer in a vertical direction; and separating the element rod from the lower substrate to form a light emitting element.

13 Claims, 25 Drawing Sheets

(51) Int. Cl.
    *H01L 33/00*      (2010.01)
    *H01L 33/22*      (2010.01)
    *H01L 33/38*      (2010.01)
    *H01L 33/40*      (2010.01)

(52) U.S. Cl.
    CPC .............. *H01L 33/22* (2013.01); *H01L 33/38* (2013.01); *H01L 33/40* (2013.01)

(56) References Cited

U.S. PATENT DOCUMENTS

| | | |
|---|---|---|
| 2011/0129675 A1 | 6/2011 | Choi et al. |
| 2012/0025167 A1 | 2/2012 | Chu et al. |
| 2013/0027623 A1* | 1/2013 | Negishi ............... H01L 25/0753 |
| | | 438/30 |
| 2013/0193558 A1 | 8/2013 | Ju et al. |
| 2014/0145237 A1* | 5/2014 | Do .......................... H01L 33/44 |
| | | 438/34 |
| 2015/0228728 A1 | 8/2015 | Dimitrakopoulos et al. |
| 2016/0372514 A1* | 12/2016 | Chang .................. G09G 3/2003 |
| 2017/0069491 A1 | 3/2017 | Cheng et al. |
| 2017/0076986 A1 | 3/2017 | Forrest et al. |
| 2018/0019377 A1 | 1/2018 | Kim et al. |
| 2019/0326474 A1 | 10/2019 | Kim et al. |
| 2021/0265529 A1 | 8/2021 | Kim et al. |

FOREIGN PATENT DOCUMENTS

| | | |
|---|---|---|
| JP | 2014-086604 A | 5/2014 |
| KR | 10-2010-0035846 A | 4/2010 |
| KR | 10-2011-0061492 A | 6/2011 |
| KR | 10-2012-0022584 A | 3/2012 |
| KR | 20120122160 A | 11/2012 |
| KR | 10-2017-0018112 A | 2/2017 |
| KR | 20180009014 A | 1/2018 |
| WO | WO 2010/132552 A1 | 11/2010 |
| WO | 2012-148231 A2 | 1/2012 |

OTHER PUBLICATIONS

Partial European Search Report issued May 12, 2022, in corresponding European Patent Application No. EP 19843280.9 (16 pages).

International Search Report for corresponding Application No. PCT/KR2019/000537, dated Apr. 30, 2019, 4pp.

* cited by examiner

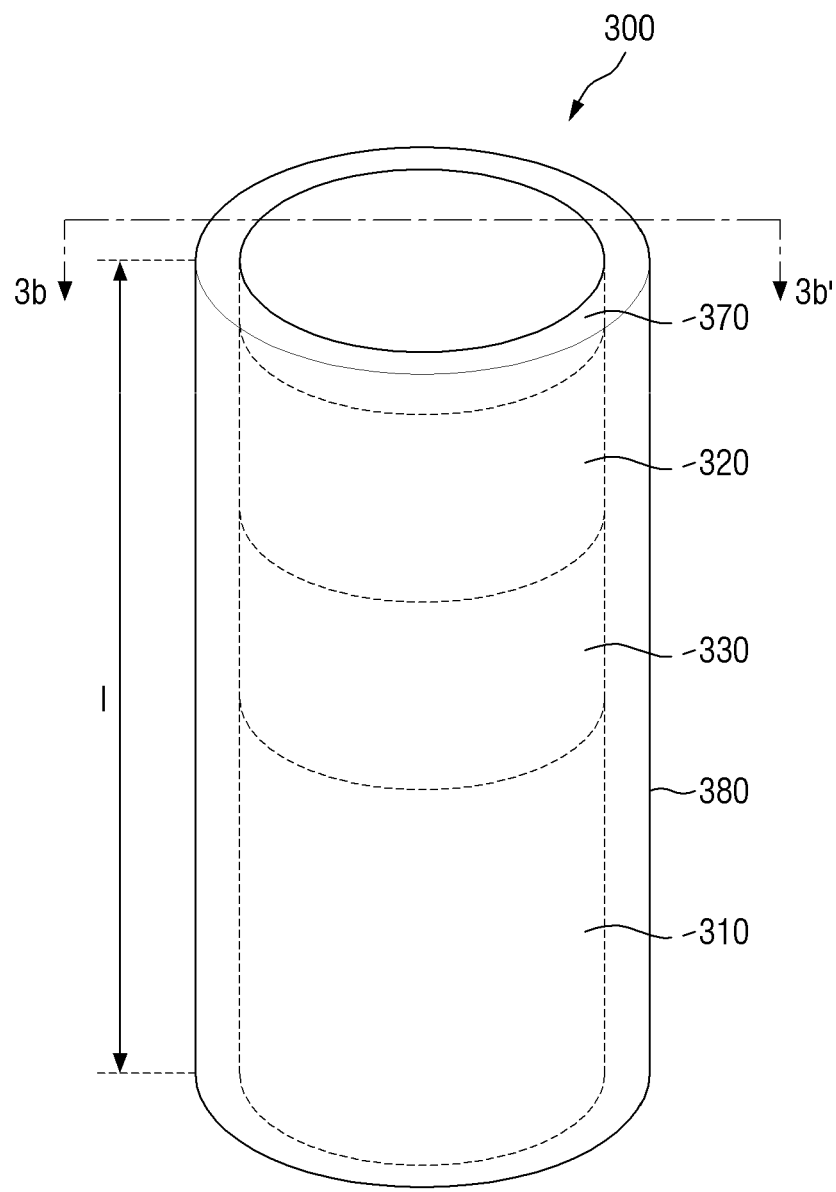

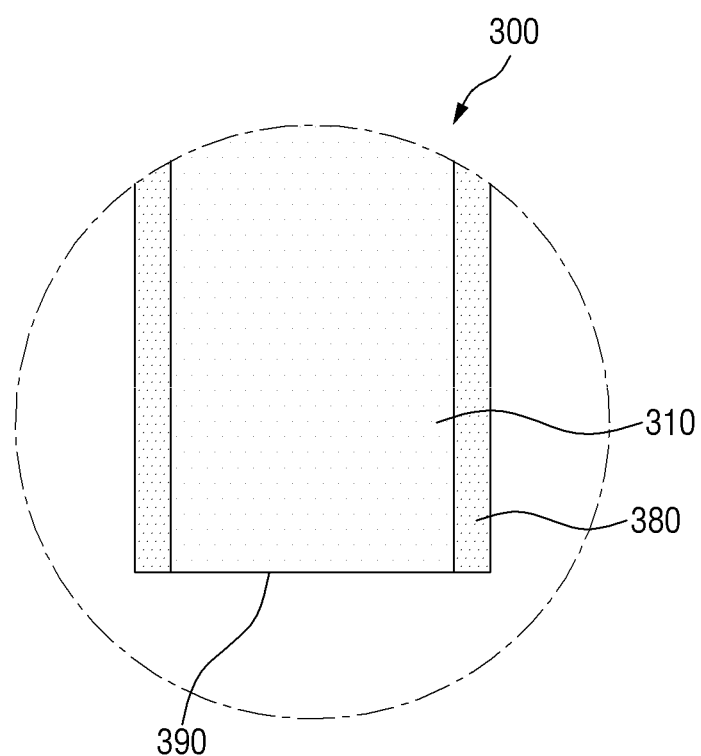

LIGHT EMITTING ELEMENT, MANUFACTURING METHOD THEREOF, AND DISPLAY DEVICE INCLUDING THE LIGHT EMITTING ELEMENT

CROSS-REFERENCE TO RELATED APPLICATION

This application is a U.S. National Phase Patent Application of Korean International Application No. PCT/KR2019/000537, which claims priority to Korean Patent Application No. 10-2018-0090544 filed on Aug. 3, 2018, the entire content of all of which is incorporated herein by reference.

TECHNICAL FIELD

The present disclosure relates to a light emitting element, a manufacturing method thereof, and a display device including the light emitting element and, in particular, to a light emitting element having an end with a smooth parting surface, a manufacturing method thereof, and a display device including the light emitting element.

BACKGROUND ART

The importance of display devices has steadily increased with the development of multimedia technology. Accordingly, various types of display devices such as an organic light emitting display (OLED), a liquid crystal display (LCD) and the like have been used.

A display device is a device for displaying an image, and includes a display panel, such as an organic light emitting display panel or a liquid crystal display panel. Among them, a light emitting display panel may include a light emitting element. Examples of a light emitting diode (LED) include an organic light emitting diode (OLED) using an organic material as a fluorescent material, and an inorganic light emitting diode using an inorganic material as a fluorescent material.

The organic light emitting diode (OLED) using an organic material as a fluorescent material of a light emitting element has advantages in that a manufacturing process is simple and a display device can have flexibility. However, it is known that the organic material is vulnerable to a high-temperature operating environment and the blue light efficiency is relatively low.

On the other hand, the inorganic light emitting diode using an inorganic semiconductor as a fluorescent material has advantages in that it has durability even in a high-temperature environment and the blue light efficiency is high compared to the organic light emitting diode. Also, in the manufacturing process, as noted as a drawback of a conventional inorganic light emitting diode, a transfer method using a dielectrophoresis (DEP) method has been developed. Accordingly, continuous studies have been conducted on the inorganic light emitting diode having superior durability and efficiency compared to the organic light emitting diode.

DISCLOSURE

Technical Problem

The inorganic light emitting diode may be manufactured by growing an n-type or p-type doped semiconductor layer and an inorganic fluorescent material layer on a substrate, forming a rod having a specific shape, and separating the rod. In the case of separating a light emitting element using a physical method, however, the lengthwise direction end surface of the light emitting element is likely to be uneven. The uneven, jagged, or rough lengthwise direction end surface of the light emitting element is likely to cause a short circuit problem in the case of contact between the light emitting element and a contact electrode.

In view of the above, aspects of the present disclosure provide a light emitting element having an even end surface for contact with a contact electrode and a manufacturing method thereof.

Aspects of the present disclosure also provide a display device including a light emitting element that is capable of preventing an open or short circuit problem of an electrode material from occurring in the case of connection with a contact electrode.

It should be noted that aspects of the present disclosure are not limited to the above-mentioned aspects, and other unmentioned aspects of the present disclosure will be clearly understood by those skilled in the art from the following descriptions.

Technical Solution

According to an exemplary embodiment of the present disclosure, a manufacturing method of a light emitting element, comprises preparing a lower substrate including a substrate and a buffer material layer formed on the substrate, forming a separating layer disposed on the lower substrate and including at least one graphene layer, forming an element deposition structure by depositing a first conductivity type semiconductor layer, an active material layer, and a second conductivity type semiconductor layer on the separating layer, forming an element rod by etching the element deposition structure and the separating layer in a vertical direction, and separating the element rod from the lower substrate to form a light emitting element.

In the forming of the element rod, the separating layer may be at least partially etched and patterned.

An interface attractive force between the separating layer and the lower substrate at a first interface between the separating layer and the lower substrate may be greater than an interface attractive force between the separating layer and the element rod at a second interface between the separating layer and the element rod.

In the forming of the light emitting element, the second interface may be peeled off, but the first interface may be not peeled off, and the patterned separating layer may remain on the lower substrate.

In the light emitting element, a parting surface, which is a surface where the element rod is peeled off from the second interface, may be substantially flat and parallel to a top surface of the second conductivity type semiconductor layer.

In the light emitting element, the parting surface may have a surface roughness in a range of 8 nm Ra to 12 nm Ra.

The forming of the element rod may further comprise forming an insulating layer disposed to surround a side surface of the element rod, and the light emitting element may further include the insulating layer disposed to surround side surfaces of the first conductivity type semiconductor layer, the active material layer, and the second conductivity type semiconductor layer.

The separating layer may include a first graphene layer and a second graphene layer disposed on the first graphene layer, the first graphene layer may form a third interface with the buffer material layer, the second graphene layer may form a fifth interface with the element rod, and the first graphene layer and the second graphene layer may form a fourth interface.

In the forming of the light emitting element, the third interface may be not peeled off, at least a portion of the fourth interface and the fifth interface may be peeled off, the first graphene layer may remain on the lower substrate, and the second graphene layer may be formed on the fourth interface with the first graphene layer or the fifth interface with the element rod.

The separating layer may include a first sub-separating layer disposed on the lower substrate and a second sub-separating layer interposed between the substrate and the buffer material layer.

The element deposition structure may further include an electrode material layer on the second conductivity type semiconductor layer.

The forming of the element rod may comprise forming an etching mask layer on the element deposition structure and an etching pattern layer including one or more nanopatterns separated from each other on the etching mask layer, forming a hole by vertically etching an area formed by the nanopatterns being separated from each other; and removing the etching mask layer and the etching pattern layer.

The element deposition structure and the separating layer may include materials different in etch selectivity, and the forming of the hole may comprise vertically etching the element deposition structure to expose at least a portion of an overlapping area between the separating layer and the area formed by the nanopatterns being separated from each other; and etching and patterning the exposed area of the separating layer.

In the vertically etching of the element deposition structure, an etchant may include chlorine gas ($Cl_2$) and oxygen gas ($O_2$), and the separating layer and element deposition structure may be etched simultaneously.

According to another exemplary of the present disclosure, a light emitting element comprises a first conductivity type semiconductor doped with a first polarity, an active layer disposed on the first conductivity type semiconductor, a second conductivity type semiconductor disposed on the active layer and doped with a second polarity opposite to the first polarity, an electrode material layer disposed on the second conductivity type semiconductor and an insulating material layer disposed to surround side surfaces of the first conductivity type semiconductor, the second conductivity type semiconductor, the active layer, and the electrode material layer, wherein a bottom surface of the first conductivity type semiconductor is substantially flat and parallel to a top surface of the second conductivity type semiconductor.

The bottom surface of the first conductivity type semiconductor and the top surface of the second conductivity type semiconductor may have a surface roughness in a range of 8 nm Ra to 12 nm Ra.

The light emitting element may have a range of 3.0 μm to 6.0 μm in length measured in a long axis direction, and have a range of 400 nm to 700 nm in length specified in the other direction crossing the long axis direction.

According to the other exemplary of the present disclosure, a display device comprises a substrate, at least one first electrode and at least one second electrode extending in a first direction on the substrate and spaced apart from each other in a second direction different from the first direction, at least one light emitting element disposed in a separation space between the first electrode and the second electrode, a first contact electrode partially covering the first electrode and contacting a first end of the light emitting element, and a second contact electrode spaced apart from the first contact electrode and partially covering the second electrode to contact a second end opposite to the first end of the light emitting element, wherein the light emitting element has a flat shape such that each side surface of the first end and the second end is parallel to a plane perpendicular to the substrate.

The light emitting element may include a first conductivity type semiconductor, an active layer disposed on the first conductivity type semiconductor, a second conductivity type semiconductor disposed on the active layer and having a polarity opposite to that of the first conductivity type semiconductor, an electrode material layer disposed on the second conductivity type semiconductor layer and an insulating material layer disposed to surround side surfaces of the first conductivity type semiconductor, the active layer, the second conductivity type semiconductor, and the electrode material layer.

Each side surface of the first end and the second end of the light emitting element may have a surface roughness in a range of 8 nm Ra to 12 nm Ra.

The above and other features and advantages of the present invention will become more apparent by describing in detail exemplary embodiments thereof with reference to the attached drawings.

Advantageous Effects

According to an embodiment, the light emitting element manufacturing method is capable of manufacturing the light emitting element to have a flat parting surface by separating an element load grown on a substrate from the substrate through graphene layer peeling. The light emitting element manufacturing method may also be capable of manufacturing a light emitting element in a way of forming an insulating layer on an outer surface of an element rod and separating the element rod from the substrate. Accordingly, the light emitting element manufacturing method is capable of manufacturing a light emitting element, which is flat at both ends thereof, without any additional etching process.

The light emitting element being arranged between two electrodes of a display device has two end surfaces that are flat and substantially parallel, and is capable of preventing an open or short circuit problem of a contact electrode material from occurring in the case of connection with a contact electrode.

Advantageous effects according to the present disclosure are not limited to those mentioned above, and various other advantageous effects are included herein.

DESCRIPTION OF DRAWINGS

FIG. 3A is a schematic diagram of a light emitting element according to an embodiment;

FIG. 4 is an enlarged view of part of FIG. 3A;

MODES OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments will be described with reference to the accompanying drawings.

Figure 1:
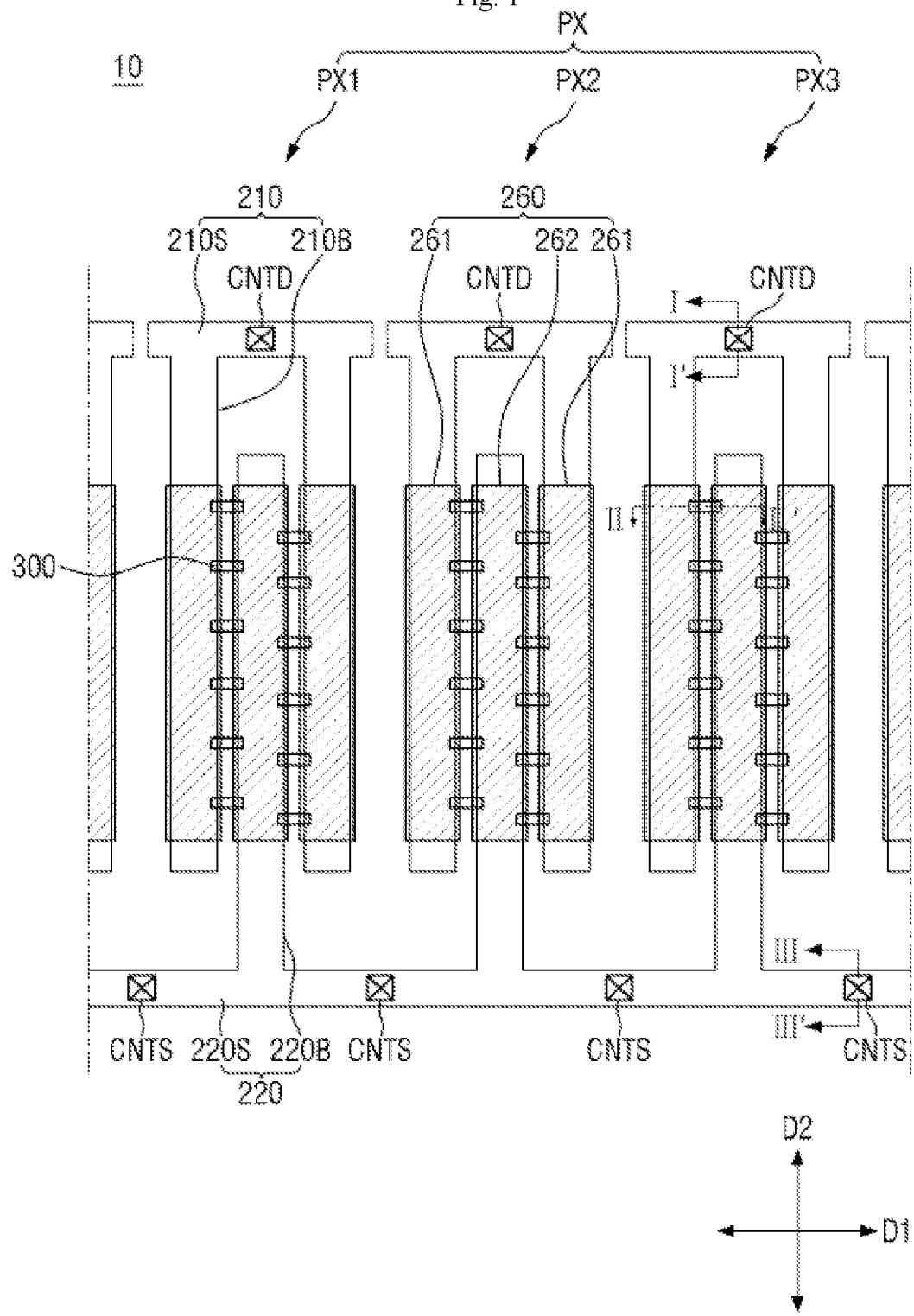
FIG. 1 is a plan view of a display device according to an embodiment.

FIG. 1 is a plan view of a display device according to an embodiment.

The display device 10 may include at least one area defined as a pixel PX. The display device 10 may include a display area composed of a plurality of pixels PX, each emitting light in a specific wavelength band to the outside of the display device 10. Although three pixels PX1, PX2, and PX3 are exemplarily illustrated in FIG. 1, it is obvious that the display device 10 may include a larger number of pixels. Although it is shown in the drawing that a plurality of pixels PX are arranged in one direction, e.g., first direction D1, in cross-sectional view, the plurality of pixels PX may also be arranged in the second direction D2 crossing the first direction D1. Further, each of the pixels PX of FIG. 1 may be divided into a plurality of portions, and each portion may constitute one pixel PX. The pixels are not necessarily arranged in parallel only in the first direction D1 as shown in FIG. 1, and may have various structures such as being arranged in a vertical direction (or the second direction D2) or in a zigzag manner.

Although not shown in the drawing, the display device 10 may include an emission area in which light emitting elements 300 are arranged for emitting certain color lights, and a non-emission area defined as an area remaining after exclusion of the emission area. The non-emission area may be covered by certain members that are not visually perceived from the outside of the display device 10. Various members for driving the light emitting elements 300 disposed in the emission area may be disposed in the non-emission area. For example, the non-emission area may include a wiring, a circuit unit, and a driving unit for applying an electrical signal to the emission area, but the present disclosure is not limited thereto.

The plurality of pixels PX may display colors by including one or more light emitting elements 300 emitting light of a specific wavelength band. The light emitted from the light emitting element 300 may be projected to the outside through a light emitting member of the display device 10. In an embodiment, each of the pixels PX presenting different colors may include different light emitting elements 300 emitting different color lights. For example, a first pixel PX1 presenting a red color may include a light emitting element 300 emitting a red light, a second pixel PX2 presenting a green color may include a light emitting element 300 emitting a green light, and a third pixel PX1 presenting a blue color may include a light emitting element 300 emitting a blue light. However, the present disclosure is not limited thereto, and the pixels presenting different colors may, in some cases, include the light emitting elements 300 emitting the same color light (e.g., blue light), or they may each include a wavelength conversion layer or a color filter on a light emission path to produce pixel-specific colors. However, the present disclosure is not limited thereto, and adjacent pixels PX may emit the same color light in some cases.

With reference to FIG. 1, the display device 10 may include a plurality of electrodes 210 and 220 and a plurality of light emitting elements 300. At least a portion of each of the electrodes 210 and 220 may be arranged in each pixel PX, and electrically connected to the light emitting elements 300 to apply an electrical signal, in order for the light emitting elements 300 to emit a certain color light.

At least a portion of each of the electrodes 210 and 220 may also contribute to producing an electric field in the pixels PX, to align the light emitting elements 300. In more detail, it is necessary to precisely align the pixel-specific (PX-specific) light emitting elements 300 during the alignment of the light emitting elements 300 emitting different color lights in the plurality of pixels PX. In the case of using an electrophoresis method for aligning the light emitting elements 300, the light emitting elements 300 may be aligned in a way of depositing a solution including the light emitting elements 300 on the display device 10 and applying alternating power thereto to create a capacitance with an electric field, which produces an electrophoresis force to the light emitting elements 300.

The plurality of electrodes 210 and 220 may include a first electrode 210 and a second electrode 220. In an exemplary embodiment, the first electrode 210 may be a pixel electrode branched to each pixel PX, and the second electrode 220 may be a common electrode connected in common to the plurality of pixels PX. One of the first and second electrodes 210 and 220 may be an anode electrode of the light emitting element 300, and the other may be a cathode electrode of the light emitting element 300. However, the present disclosure is not limited thereto, and the reverse may also be the case.

The first and second electrodes 210 and 220 may include respective electrode stems 210S and 220S arranged to extend in the first direction D1, and at least one respective electrode branches 210B and 220B extending, in the second direction D2 crossing the first direction D1, from the respective electrode stems 210S and 220S.

In detail, the first electrode 210 may include a first electrode stem 210S, arranged to extend in the first direction D1, and at least one first electrode branch 210B, branched from the first electrode stem 210S and extending in the second direction D2. Although not shown in the drawing, the first electrode stem 210S may be connected, at one end thereof, to a signal input pad and extend, at the other end thereof, in the first direction D1, maintaining electrical disconnection between the pixels PX. The signal input pad may be connected to a power source of the display device 10 or the outside, to apply an electrical signal or, in the case of aligning the light emitting elements 300, alternating power to the first electrode stem 210S.

The first electrode stem 210S of one pixel may be arranged substantially on the same line as the first electrode stem 210S of neighboring pixels belonging to the same row (e.g., adjacent in the first direction D1). That is, the first electrode stem 210S of one pixel may be arranged such that two ends thereof terminate between corresponding pixels while being spaced apart from each other, and the first electrode stems 210S of the neighboring pixels may be aligned with an extension line of the first electrode stem 210S of the one pixel. In this manner, the first electrode stem 210S may be arranged in a way of being formed as an continuous stem electrode in a manufacturing process, and cut off by a laser or the like to be open, after performing the alignment process of the light emitting elements 300. Accordingly, the first electrode stems 210S of the respective pixel PX may apply different electrical signals to the respective first electrode branches 210B, which may operate independently of each other.

The first electrode branch 210B may be branched from at least part of the first electrode stem 210S and extend in the second direction D2, and may terminate to keep a distance from the second electrode stem 220S arranged to face the first electrode stem 210S. That is, the first electrode branch 210B may be arranged to be connected, at one end thereof, to the first electrode stem 210S and placed, at the other end thereof, inside the pixel PX keeping a distance from the second electrode stem 220S. The first electrode branch 210B may be connected to the first electrode stem 210S, which is electrically separate per pixel PX, so as to receive a different electrical signal per pixel PX.

It may also be possible that one or more first electrode branches 210B are arranged per pixel PX. Although it is shown in FIG. 1 that two first electrode branches 210B are arranged, and the second electrode branch 220B is arranged therebetween, the present disclosure is not limited thereto, and more first electrode branches 210B may be arranged. In this case, the first electrode branches 210B may be arranged alternately to be separated from the plurality of second electrode branches 220B, such that a plurality light emitting elements 300 are arranged therebetween. In some embodiments, the second electrode branch 220B may be arranged between the first electrode branches 210B, such that each pixel PX is symmetrical about the second electrode branch 220B. However, the present disclosure is not limited thereto.

The second electrode 220 may include a second electrode stem 220S arranged to extend in the first direction D1 and face the first electrode stem 210S, keeping a distance from the first electrode stem 210S, and at least one second electrode branch 220B branched from the second electrode stem 220S to extend in the second direction D2 and face the first electrode branch 210B, keeping a distance from the first electrode branch 210B. The second electrode stem 220S may also be connected to the signal input pad at one end thereof, like the first electrode stem 210S. However, the second electrode stem 220S may extend, at the other end thereof, in the first direction D1 toward the plurality of adjacent pixels PX. That is, the second electrode stem 220S may be electrically continuous between individual pixels PX. Accordingly, the second electrode stem 220S of a certain pixel is connected at opposite ends thereof to one of the ends of the second electrode stems 220S of the neighboring pixels between the pixels PX, to apply the same electrical signal to each pixel PX.

The second electrode branch 220B may be branched from at least part of the second electrode stem 220S and extend in the second direction D2, and may terminate to keep a distance from the first electrode stem 210S. That is, the second electrode branch 220B may be arranged to be connected at one end thereof to the second electrode stem 220S and placed at the other end thereof inside the pixel PX, keeping a distance from the first electrode stem 210S. The second electrode branch 220B may be connected to the second electrode stem 220S, which is electrically continuous in the respective pixels PX, so as to receive the same electrical signal for each pixel PX.

The second electrode branch 220B may be arranged to face the first electrode branch 210B, keeping a distance from the first electrode branch 210B. Here, the first and second electrode stems 210S and 220S face each other about the center of each pixel PX, keeping a distance, such that the first and second electrode branches 210B and 220B extend in the opposite directions. That is, the first electrode branch 210B may extend to one orientation of the second direction D2, and the second electrode branch 220B may extend to the other orientation of the second direction D2, such that one ends of the respective branches are arranged to face opposite orientations about the center of the pixel PX. However, the present disclosure is not limited thereto, and the first and second electrode stems 210S and 220S may be arranged to face the same orientation about the center of the pixel PX, keeping a distance from each other. In this case, the first and second electrode branches 210B and 220B branched from the respective electrode stems 210S and 220S may extend in the same direction.

Although it is shown in FIG. 1 that one second electrode branch 220B is arranged in each pixel PX, the present disclosure is not limited thereto, and more second electrode branches 220B may be arranged.

The plurality of light emitting elements 300 may be aligned between the first and second electrode branches 210B and 220B. In detail, at least part of the plurality of the light emitting elements 300 are each electrically connected at one end thereof to the first electrode branch 210B and at the other end thereof to the second electrode branch 220B.

The plurality of light emitting elements 300 may be aligned substantially in parallel with one another, keeping a distance in the second direction D2. The interval between the light emitting elements 300 is not particularly limited. One plurality of light emitting elements 300 may be adjacently arranged to form a cluster, while another plurality of light emitting elements 300 may be arranged keeping a predetermined distance from one another to form a cluster, and they may also be aligned to face one orientation at a non-uniform density.

The first and second electrode branches 210B and 220B may have respective contact electrodes 260 arranged thereon.

The plurality of contact electrodes 260 may be arranged to extend in the second direction D2 and spaced apart from one another in the first direction D1. The contact electrodes 260 may contact at least one ends of the light emitting elements 300, and may contact the first and second electrodes 210 and 220 to receive an electrical signal. Accordingly, the contact electrodes 260 may transfer the electrical signal received through the first and second electrodes 220 to the light emitting elements 300.

In detail, the contact electrodes 260 may include a first contact electrode 261 and a second contact electrode 262 arranged on the respective electrode branches 210B and 220B to partially cover them and contact one or the other ends of the light emitting elements 300.

The first contact electrode 261 may be arranged on the first electrode branch 210B to contact one ends of the light emitting elements 300 that are electrically connected to the first electrode 210. The second contact electrode 262 may be arranged on the second electrode branch 220B to contact the other ends of the light emitting elements 300 that are electrically connected to the second electrode 220.

In some embodiments, the opposite ends of each of the light emitting elements 300 that are each electrically connected to the first electrode branch 210B or the second electrode branch 220B may be an n-type or p-type doped conductive semiconductor layer. In the case where one end of a light emitting element 300 that is electrically connected to the first electrode branch 210B is a p-type doped conductive semiconductor layer, the other end of the light emitting element 300 that is electrically connected to the second electrode branch 220B may be an n-type doped conductive semiconductor layer. However, the present disclosure is not limited thereto, and an opposite case may also be possible.

The first and second contact electrodes 261 and 262 may be arranged to partially cover the respective first and second electrode branches 210B and 220B. As shown in FIG. 1, the first and second contact electrodes 261 and 262 may be arranged to extend in the second direction D2 and face each other keeping a distance. However, the first and second contact electrodes 261 and 262 may terminate at one ends thereof to expose one ends of the respective electrode branches 210B and 220B. The first and second contact electrodes 261 and 262 may also terminate at the other ends thereof, so as not to overlap the respective electrode stems 210S and 220S and be spaced apart therefrom. However, the present disclosure is not limited thereto, the first and second contact electrodes 261 and 262 may cover the respective electrode branches 210B and 220B.

Meanwhile, as shown in FIG. 1, the first and second electrode stems 210S and 220S may be electrically connected to a thin film transistor 120 or a power wiring 161 (to be described later) via respective contact holes, e.g., a first electrode contact hole CNTD and a second electrode contact hole CNTS. Although it is shown in FIG. 1 that the first and second electrode stems 210S and 220S each have a contact hole arranged thereon per pixel PX, the present disclosure is not limited thereto. Because the second electrode stem 220S may extend to establish an electrical connection with the adjacent pixels PX as described above, the second electrode stem 220S may, in some embodiments, be electrically connected to the thin film transistor via one contact hole.

A description is made hereinafter of the configuration of the plurality of members arranged on the display device 10 in more detail with reference to FIG. 2.

Figure 2:
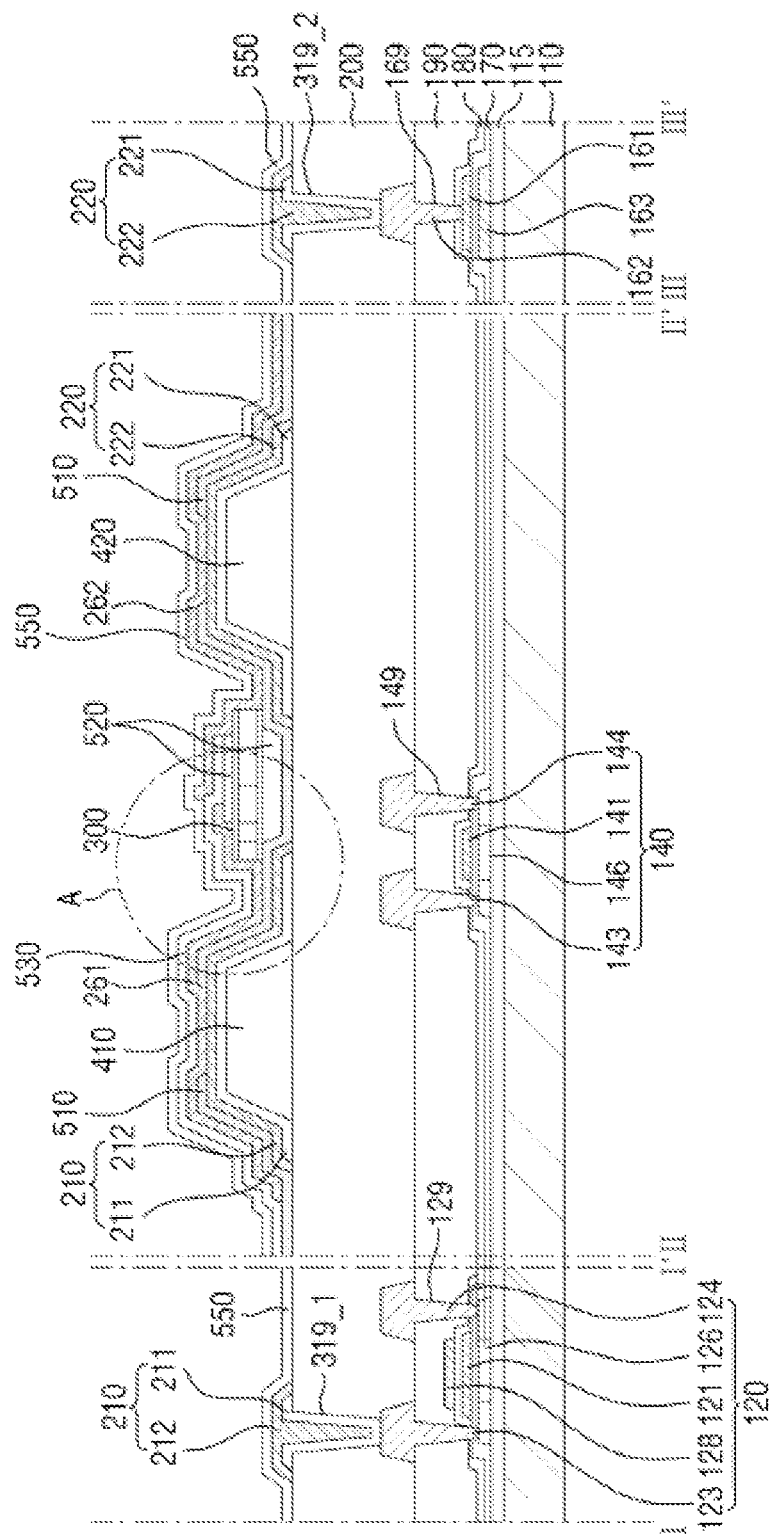
FIG. 2 is a cross-sectional view taken along lines I-I', II-II' and III'-III' of FIG. 1.

FIG. 2 is a cross-sectional view taken along lines I-I', II-II' and of FIG. 1. Although FIG. 2 shows a single pixel PX, the configuration may be identically applicable to other pixels. FIG. 2 shows a cross section across one and the other ends of a certain light emitting element 300.

Referring to FIGS. 1 and 2, the display device 10 may include a substrate 110, thin film transistors 120 and 140 disposed on the substrate 110, and the electrodes 210 and 220 disposed on the thin film transistors 120 and 140, and the light emitting elements 300. The thin film transistors may include a first thin film transistor 120 and a second thin film transistor 140, and they may be a driving transistor and a switching transistor, respectively. Each of the thin film transistors 120 and 140 may include an active layer, a gate electrode, a source electrode, and a drain electrode. The first electrode 210 may be electrically connected to the drain electrode of the first thin film transistor 120.

Specifically, the substrate 110 may be an insulating substrate. The substrate 110 may be made of an insulating material such as glass, quartz, or polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Further, the substrate 110 may be a rigid substrate, but may also be a flexible substrate which can be bent, folded or rolled.

A buffer layer 115 may be disposed on the substrate 110. The buffer layer 115 can prevent diffusion of impurity ions, prevent penetration of moisture or external air, and perform a surface planarization function. The buffer layer 115 may include silicon nitride, silicon oxide, silicon oxynitride, or the like.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, oxide semiconductor, and the like.

A first gate insulating layer 170 is disposed on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These may be used alone or in combination with each other.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power wiring 161 disposed on the auxiliary layer 163, with the first gate insulating layer 170 interposed therebetween, respectively. The first conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single layer or a multilayer.

A second gate insulating layer 180 is disposed on the first conductive layer. The second gate insulating layer 180 may be an interlayer insulating layer. The second gate insulating layer 180 may be formed of an inorganic insulating material such as silicon oxide, silicon nitride, silicon oxynitride, hafnium oxide, aluminum oxide, titanium oxide, tantalum oxide, zinc oxide, and the like.

A second conductive layer is disposed on the second gate insulating layer 180. The second conductive layer includes a capacitor electrode 128 disposed on the first gate electrode 121, with the second gate insulating layer 180 interposed therebetween. The capacitor electrode 128 may form a storage capacitor in cooperation with the first gate electrode 121.

In the same way as the first conductive layer described above, the second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is disposed on the second conductive layer. The interlayer insulating layer 190 may be an interlayer insulating film. Further, the interlayer insulating layer 190 may perform a surface planarization function. The interlayer insulating layer 190 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

A third conductive layer is disposed on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power electrode 162 disposed on the power wiring 161.

The first source electrode 124 and the first drain electrode 123 may be electrically connected to the first active layer 126 through a first contact hole 129 passing through the interlayer insulating layer 190 and the second gate insulating layer 180. The second source electrode 144 and the second drain electrode 143 may be electrically connected to the second active layer 146 through a second contact hole 149 passing through the interlayer insulating layer 190 and the second gate insulating layer 180. The power electrode 162 may be electrically connected to the power wiring 161 through a third contact hole 169 passing through the interlayer insulating layer 190 and the second gate insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single layer or a multilayer. For example, the third conductive layer may have a stacked structure of Ti/Al/Ti, Mo/Al/Mo, Mo/AlGe/Mo, or Ti/Cu.

An insulating substrate layer 200 is disposed on the third conductive layer. The insulating substrate layer 200 may be formed of an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The surface of the insulating substrate layer 200 may be flat.

The insulating substrate layer 200 may include a plurality of banks 410 and 420. The plurality of banks 410 and 420 may be arranged to face each other, keeping a distance therebetween, inside each pixel PX, and the distanced banks 410 and 420, e.g., a first bank 410 and a second bank 420, may have the first electrode 210 and the second electrode 220 arranged respectively thereon. As shown in FIG. 1, three banks 410 and 420, i.e., two first banks 410 and one second bank 420, are arranged to be covered by the respective first and second electrodes 210 and 220 within one pixel PX. Although FIG. 2 shows only a cross section of one first bank 410 and one second bank 420 among them, the arrangement configuration thereof may be identically applicable to the other first bank 410 not shown in FIG. 2.

However, the present disclosure is not limited thereto, and more banks 410 and 420 may be arranged within one pixel PX. For example, it may be possible that more banks 410 and 420 are arranged along with more first and second electrodes 210 and 220. The banks 410 and 420 may include at least one first bank 410 on which the first electrode 210 is arranged, and at least one second bank 420 on which the second electrode 220 is arranged. In this case, the first and second banks 410 and 420 may be arranged to face each other keeping a distance therebetween, such that the plurality of banks are alternately arranged in one direction. In some embodiments, it may be possible that two first banks 410 are arranged, keeping a distance therebetween, and one second bank 420 is arranged between the distanced first banks 410.

Furthermore, although not shown in FIG. 2, the first and second electrodes 210 and 220 may include the respective electrode stems 210S and 220S and the respective electrode branches 210B and 220B as described above. It may be understood in FIG. 2 that the first and second electrode branches 2106 and 220B are respectively arranged on the first and second banks 410 and 420.

The plurality of banks 410 and 420 may be formed with the substantially same material in a single process. In this case, the banks 410 and 420 may form a grid pattern. The banks 410 and 420 may include polyimide.

Meanwhile, although not shown in the drawing, at least part of the plurality of banks 410 and 420 may be arranged on a boundary of the pixels PX to make them distinct. Such banks may be arranged in a substantially grid pattern along with the aforementioned first and second banks 410 and 420. At least part of the banks 410 and 420 arranged on the boundary of the pixels PX may be formed to cover electrode lines of the display device 10.

The plurality of banks 410 and 420 may each have a structure protruding at least partially from the insulating substrate layer 200. The banks 410 and 420 may protrude upward from a flat plane on which the light emitting elements 300 are arranged, such that a protruding part may at least partially have slopes. The banks 410 and 420 having a protruded structure with slopes may have reflection layers 211 and 221 (to be described later) arranged thereon to reflect incident light. The light directed from the light emitting element 300 to the reflection layers 211 and 221 may be reflected to the outside of the display device 10, i.e., upward from the banks 410 and 420. The banks 410 and 420 with the protruded structure may not be limited in shape. Although it is shown in FIG. 2 that the banks have a shape with a flat top surface and angular corners, the present disclosure is not limited thereto, and the banks may be protruded to have round corners.

The plurality of banks 410 and 420 may have reflection layers 211 and 221 arranged thereon.

The first reflection layer 211 covers the first bank 410 and is partially electrically connected to the first drain electrode 123 of the first thin film transistor 120 via a fourth contact hole 319_1 penetrating the insulating substrate layer 200. The second reflection layer 221 covers the second bank 420 and is partially electrically connected to the power electrode 162 via a fifth contact hole 319_2 penetrating the insulating substrate layer 200.

The first reflection layer 211 may be electrically connected to the first drain electrode 123 of the first thin film transistor 120 via the fourth contact hole 319_1 within the pixel PX. Accordingly, the first thin film transistor 120 may be arranged in an area overlapping the pixel PX. FIG. 1 shows electrical connection to the first thin film transistor 120 via the first electrode contact hole CNTD arranged on the first electrode stem 210S. That is, the first electrode contact hole CNTD may be the fourth contact hole 319_1.

The second reflection layer 221 may also be electrically connected to the power electrode 162 via the fifth contact hole 319_2 within the pixel PX. FIG. 2 shows that the second reflection layer 221 is connected through the fifth contact hole 319_2 within one pixel PX. FIG. 1 shows that the second electrode 220 of each pixel PX is electrically connected to the power wiring 161 via the plurality of second electrode contact holes CNTS on the second electrode stem 220S. That is, the second contact holes CNTS may be the fifth contact hole 319_2.

As described with reference to FIG. 1, the first and second contact holes CNTD and CNTS may be respectively arranged on the first and second electrode stems 210S and 220S. In this respect, FIG. 2 shows that, in the cross-sectional view of the display device 10, the first and second electrodes 210 and 220 are electrically connected to the first thin film transistor 120, or the power wiring 161, via the respective fourth and fifth contact holes 319_1 and 319_2, in an area separated from the banks 410 and 420 on which the first and second electrode branches 210B and 220B are arranged.

However, the present disclosure is not limited thereto. For example, in FIG. 1, the second electrode contact holes CNTS may be arranged at various positions on the second electrode stem 220S and, in some cases, on the second electrode branch 220B. In some embodiments, the second reflection layer 221 may also be connected to one second electrode contact hole CNTS, or the fifth contact hole 319_2, in an area out of one pixel PX.

In an area outside the emission area in which the pixels PX of the display device 100 are arranged, e.g., an outside area of the emission area, there may be a non-emission area in which no light emitting elements 300 are arranged. As described above, the second electrodes 220 of each pixel PX may be electrically connected via the second electrode stem 220S, so as to receive the same electrical signal.

In some embodiments, in the case of the second electrode 220, the second electrode stem 220S may be electrically connected to the power electrode 162 via one second electrode contact hole CNTS in the non-emission area as the outside area of the display device 10. Unlike the display device 10 of FIG. 1, because the second electrode stem 220S is arranged to extend to adjacent pixels and be electrically connected to each other, even though the second electrode stem 220S is connected to the power electrode 162 via one contact hole, it may be possible to apply the same electrical signal to the second electrode branches 220B of the respective pixels PX. In the case of the second electrode 220 of the display device 10, the position of the contact hole for receiving an electrical signal from the power electrode 162 may vary according to the structure of the display device 10. However, the present disclosure is not limited thereto.

Meanwhile, with reference back to FIGS. 1 and 2, the reflection layers 211 and 221 may include a material having high reflectivity for reflecting the light emitted from the light emitting elements 300. For example, the reflection layers 211 and 221 may include, but are not limited to, a material such as silver (Ag) and copper (Cu).

The first and second reflection layers 211 and 221 may include first and second electrode layers 212 and 222 arranged respectively thereon.

The first electrode layer 212 may be arranged directly on the first reflection layer 211. The first electrode layer 212 may have a pattern substantially identical with that of the first reflection layer 211. The second electrode layer 222 may be arranged directly on the second reflection layer 221 to be spaced apart from the first electrode layer 212. The second electrode layer 222 may have a pattern that is substantially identical with that of the second reflection layer 221.

In an embodiment, the electrode layers 212 and 222 may cover the reflection layers 211 and 221 respectively thereebeneath. That is, the electrode layers 212 and 222 may be formed to be larger in size than the reflection layers 211 and 221, to cover the side end surfaces of the reflection layers 211 and 221. However, the present disclosure is not limited thereto.

The first and second electrode layers 212 and 222 may transfer, to contact electrodes 261 and 262 (to be described later), an electrical signal directed to the first and second reflection layers 211 and 221 connected to the first thin film transistor 120 or the power electrode 162. The electrode layers 212 and 222 may include a transparent conductive material. For example, the electrode layers 212 and 222 may include a material such as indium tin oxide (ITO), indium zinc oxide (IZO), and indium tin zinc oxide (ITZO), but are not limited thereto. In some embodiments, the reflective layers 211 and 221 and the electrode layers 212 and 222 may have a structure in which at least one transparent conductive layer such as ITO, IZO, or ITZO and at least one metal layer such as silver (Ag) or copper (Cu) are stacked. For example, the reflective layers 211 and 221 and the electrode layers 212 and 222 may have a stacked structure of ITO/Ag/ITO.

The first reflective layer 211 and the first electrode layer 212 disposed on the first bank 410 form the first electrode 210. The first electrode 210 may protrude to regions extending from both ends of the first bank 410, and accordingly, the first electrode 210 may contact the insulating substrate layer 200 in the protruding region. The second reflective layer 221 and the second electrode layer 222 disposed on the second bank 420 form the second electrode 220. The second electrode 220 may protrude to regions extending from both ends of the second bank 420, and accordingly, the second electrode 220 may contact the insulating substrate layer 200 in the protruding region.

The first and second electrodes 210 and 220 may be respectively arranged to cover the entire areas of the first and second banks 410 and 420. However, as described above, the first and second electrodes 210 and 220 are arranged to face each other keeping a distance therebetween. Between the electrodes, a first insulating layer 510, which is to be described later, may be arranged, and the light emitting elements 300 may be arranged thereon.

In addition, the first reflective layer 211 may receive a driving voltage from the first thin film transistor 120, and the second reflective layer 221 may receive a source voltage from the power wiring 161. Thus, the first electrode 210 and the second electrode 220 receive the driving voltage and the source voltage, respectively. The first electrode 210 may be electrically connected to the first thin film transistor 120, and the second electrode 220 may be electrically connected to the power wiring 161. Accordingly, the first and second contact electrodes 261 and 262 arranged respectively on the first and second electrodes 210 and 220 may receive the driving voltage and the source voltage. The driving voltage and the source voltage may be transferred to the light emitting elements 300, such that the light emitting elements 300 emit light with a predetermined electric current flowing therethrough.

The first insulating layer 510 is arranged to partially cover the first and second electrodes 210 and 220. The first insulating layer 510 may be arranged to mostly cover the top surfaces of the first and second electrodes 210 and 220 and partially expose the first and second electrodes 210 and 220. The first insulating layer 510 may also be arranged in the space between the first and second electrodes 210 and 220. The first insulating layer 510 may have an islet or line shape formed along the space between the first and second electrode branches 210B and 220B in plan view.

FIG. 2 shows that the first insulating layer 510 is arranged in the space between one first electrode 210 (e.g., first electrode branch 210B) and one second electrode 220 (e.g., second electrode branch 220B). However, as described above, there may be a plurality of the first and second electrodes 210 and 220, such that the first insulating layer 510 may be also arranged between one first electrode 210 and another second electrode 220, or between one second electrode 220 and another first electrode 210. The first insulating layer 510 may be arranged to partially cover the side surfaces of the first and second electrodes 210 and 220 that are opposite to the side surfaces facing each other. That is, the first insulating layer 510 may be arranged to expose center parts of the first and second electrodes 210 and 220.

On the first insulating layer 510, the light emitting element 300 is arranged. The first insulating layer 510 may be arranged between the light emitting element 300 and the insulating substrate layer 200. The first insulating layer 510 may have a bottom surface contacting the insulating substrate layer 200, and the light emitting element 300 may be arranged on the top surface of the first insulating layer 510. The first insulating layer 510 may contact the electrodes 210 and 220 at both side surfaces thereof to electrically insulate the first and second electrodes 210 and 220 from each other.

The first insulating layer 510 may overlap a partial area on the electrodes 210 and 220, e.g., part of the area protruding in a direction in which the first and second electrodes 210 and 220 face each other. The first insulating layer 510 may also be arranged on the areas where the sloping surfaces and flat top surfaces of the banks 410 and 420 overlap the electrodes 210 and 220.

For example, the first insulating layer 510 may cover the end parts protruding in the direction in which the first and second electrodes 210 and 220 face each other. The first insulating layer 510 may contact the insulating substrate layer 200 partially on the bottom surface of the first insulating layer 510, and may contact the electrodes 210 and 220 partially on the bottom surface thereof and on the side surfaces thereof. Accordingly, the first insulating layer 510 may protect regions overlapping the respective electrodes 210 and 220 and electrically insulate them. Further, the first insulating layer 510 may prevent a first conductivity type semiconductor 310 and a second conductivity type semiconductor 320 of the light emitting element 300 from directly contacting other members, thereby preventing damage to the light emitting element 300.

However, the present disclosure is not limited thereto, and the first insulating layer 510 may be arranged only on the areas overlapping the sloping side surfaces of the banks 410 and 420 in the areas on the first and second electrodes 210 and 220 in some embodiments. In this case, the bottom surface of the first insulating layer 510 may terminate on the sloping side surfaces of the banks 410 and 420, and the electrodes 210 and 220 arranged on part of the sloping side surfaces of the banks 410 and 420 may be exposed to contact the contact electrodes 260.

The first insulating layer 510 may also be arranged to expose both ends of the light emitting element 300. Accordingly, the contact electrodes 260 may contact the exposed top surfaces of the electrodes 210 and 220 and both ends of the light emitting element 300, and the contact electrode 260 may transfer the electrical signal applied to the first and second electrodes 210 and 220 to the light emitting element 300.

At least one light emitting element 300 may be disposed between the first electrode 210 and the second electrode 220. Although it is shown in FIG. 2 that one light emitting element 300 is arranged between the first and second electrodes 210 and 220, it is apparent that a plurality light emitting elements 300 may be arranged in a different direction (e.g., second direction D2) in plan view as shown in FIG. 1.

In detail, the light emitting element 300 may be electrically connected to the first electrode 210 at one end thereof and the second electrode 220 at the other end thereof. The both ends of the light emitting elements 300 may respectively contact the first and second contact electrodes 261 and 262.

Meanwhile, FIG. 1 exemplifies the case where only the light emitting elements 300 emitting the same color light are arranged in each pixel PX. However, the present disclosure is not limited thereto, and as described above, the light emitting elements 300 emitting light of different colors may be disposed together in one pixel PX.

The light emitting element 300 may be a light emitting diode. The light emitting element 300 may be a nanostructure mostly having a nano-size. The light emitting element 300 may be an inorganic light emitting diode made of an inorganic material. When the light emitting element 300 is an inorganic light emitting diode, a light emitting material having an inorganic crystal structure is disposed between two electrodes facing each other, and an electric field is formed in a specific direction in the light emitting material. Then, the inorganic light emitting diode may be aligned between the two electrodes having a specific polarity.

In some embodiments, the light emitting element 300 may have a stacked structure including a first conductivity type semiconductor 310, an element active layer 330, a second conductivity type semiconductor 320, and an electrode material layer 370. The light emitting element 300 may be manufactured by depositing, horizontally, the first conductivity type semiconductor 310, the element active layer 330, and the second conductivity type semiconductor 320, and the electrode material layer 370 in order on the insulating substrate layer 200. That is, the light emitting elements 300 formed by depositing the plurality of layers may be arranged in the widthwise direction parallel with the insulating substrate layer 200. However, the present disclosure is not limited thereto, and the light emitting elements 300 may be manufactured such that the layers are deposited in the reverse order between the first and second electrodes 210 and 220.

The second insulating layer 520 may be arranged to overlap at least part of the light emitting element 300. The second insulating layer 520 may protect the light emitting element 300, and simultaneously fix the light emitting element 300 between the first and second electrodes 210 and 220.

Although it is shown in FIG. 2 that the second insulating layer 520 is arranged only on the top surface of the light emitting element 300 in cross-sectional view, the second insulating layer 520 may be arranged to surround the outer surface of the light emitting element 300. That is, like the first insulating layer 510, the second insulating layer 520 may be arranged to have an islet or line shape extending in the second direction D2 along the space between the first and second electrode branches 210B and 220B in plan view.

Part of the material of the second insulating layer 520 may also be arranged at the area where the bottom surface of the light emitting element 300 and the first insulating layer 510 overlap each other. That part may be formed when the light emitting element 300 is aligned on the first insulating layer 510, and then the second insulating layer 520 is disposed thereon during the manufacture of the display device 10. That part may also be formed by the second insulating layer 520 partially permeating, during the formation of the second insulating layer 520, into pores formed in a section of the first insulating layer 510 contacting the bottom surface of the light emitting element 300.

The second insulating layer 520 may be arranged to expose both end surfaces of the light emitting element 300. That is, in cross-sectional view, the second insulating layer 520 arranged on the top surface of the light emitting element 300 is shorter in length, measured in an axis direction, than the light emitting element 300, such that the second insulating layer 520 may be contracted inward in comparison with the both ends of the light emitting element 300. Accordingly, the first insulating layer 510, the light emitting element 300, and the second insulating layer 520 may be deposited such that the side surfaces thereof are aligned in a stepwise manner. This may facilitate contact between the contact electrodes 261 and 262 and both end surfaces of the light emitting element 300. However, the present disclosure is not limited thereto. The second insulating layer 520 and the light emitting element 300 may have the same length, and both sides thereof may be aligned.

Meanwhile, the second insulating layer 520 may be formed in a way of depositing the corresponding material on the first insulating layer 510, and patterning the corresponding material in an area, e.g., area exposed for contact of the light emitting element 300 to the contact electrode 260. Patterning the second insulating layer 520 may be performed with a conventional dry etching or wet etching process. Here, the first and second insulating layers 510 and 520 may include materials different in etch selectivity, to prevent the first insulating layer 510 from being patterned. That is, the first insulating layer 510 may serve as an etching stopper in patterning the second insulating layer 520.

Accordingly, the first insulating layer 510 may not undergo material damage even when the second insulating layer 520 covering the outer surface of the light emitting element 300 is patterned to expose the both ends of the light emitting element 300. In particular, the first insulating layer 510 and the light emitting element 300 may have smooth contact surfaces at the both ends of the light emitting element 300 where the light emitting element 300 and the contact electrode 260 contact each other.

On the second insulating layer 520, the first contact electrode 261 disposed on the first electrode 210 and overlapping at least part of the second insulating layer 520, and the second contact electrode 262 disposed on the second electrode 220 and overlapping at least part of the second insulating layer 520, may be arranged.

The first and second contact electrodes 261 and 262 may be respectively arranged on the top surfaces of the first and second electrodes 210 and 220. In detail, the first and second contact electrodes 261 and 262 may respectively contact the first and second electrode layers 212 and 222 in the area where the first insulating layer 510 is patterned to expose parts of the first and second electrodes 210 and 220. The first and second contact electrodes 261 and 262 may contact one end side of the light emitting element 300, e.g., the first conductivity type semiconductor 310, the second conductivity type semiconductor 320, or the electrode material layer 370. Accordingly, the first and second contact electrodes 261 and 262 may transfer the electrical signal applied to the first and second electrode layers 212 and 222 to the light emitting element 300.

The first contact electrode 261 may be arranged on the first electrode 210 to cover the first electrode 210 in part, and contact the light emitting element 300 and the first and second insulating layers 510 and 520 in part on the bottom surface of the first contact electrode 261. One end of the first contact electrode 261 that is oriented toward the second contact electrode 262 is arranged on the second insulating layer 520. The second contact electrode 262 may be arranged on the second electrode 220 to cover the second electrode 220 in part, and contact the light emitting element 300 and the first and third insulating layers 510 and 530 in part on the bottom surface of the second contact electrode 262. One end of the second contact electrode 262 that is oriented toward the first contact electrode 261 is arranged on the third insulating layer 530.

The first and second insulating layers 510 and 520 may be patterned into an area to cover the first and second electrodes 210 and 220 on the top surface of the first and second banks 410 and 420. Accordingly, the first and second electrode layers 212 and 222 of the respective first and second electrodes 210 and 220 may be exposed to be electrically connected to the respective contact electrodes 261 and 262.

The first contact electrode 261 and the second contact electrode 262 may be spaced apart from each other on the second insulating layer 520 or the third insulating layer 530. That is, the first and second contact electrode 261 and 262 may be arranged to contact the light emitting element 300 and the second insulating layer 520 or the third insulating layers 530 together and, on the second insulating layer 520, to be spaced apart in the deposition direction for electrical insulation. Accordingly, the first and second contact electrodes 261 and 262 may respectively receive different powers from the first thin film transistor 120 and the power wiring 161. For example, the first contact electrode 261 may receive a driving voltage applied from the first thin film transistor 120 to the first electrode 210, and the second contact electrode 262 may receive a common source voltage applied from the power wiring 161 to the second electrode 220. However, the present disclosure is not limited thereto.

Meanwhile, as shown in FIG. 1, neither the first contact electrode 261 nor the second contact electrode 262 is arranged on the first and second contact holes CNTD and CNTS formed on the first and second electrode stems 210S and 220S. That is, even in FIG. 5, the first and second contact electrodes 261 and 262 may not respectively overlap the areas where the first and second electrode contact holes CNTD and CNTS are arranged. However, the present disclosure is not limited thereto, and the first and second contact electrode 261 and 262, in some cases, may partially overlap the area where the first electrode contact hole CNTD or the second electrode contact hole CNTD is arranged on the respective first and second electrodes 210 and 220.

The contact electrodes 261 and 262 may include a conductive material. For example, they may include ITO, IZO, ITZO, aluminum (Al), or the like. However, the present disclosure is not limited thereto.

Further, the contact electrodes 261 and 262 may include the same material as the electrode layers 212 and 222. The contact electrodes 261 and 262 may be arranged to have substantially the same pattern on the electrode layers 212 and 222 to contact the electrode layers 212 and 222. For example, the first and second contact electrodes 261 and 262 contacting the first and second electrode layers 212 and 222 may transfer the electrical signals applied to the first and second electrode layers 212 and 222 to the light emitting element 300.

The third insulating layer 530 may be arranged on the first contact electrode 261 to electrically insulate the first and second contact electrodes 261 and 262 from each other. The third insulating layer 530 may be arranged to cover the first contact electrode 261 and not to overlap an area of the light emitting element 300, such that the light emitting element 300 contacts the second contact electrode 262. The third insulating layer 530 may partially contact the first contact electrode 261, the second contact electrode 262, and the second insulating layer 520 on the top surface of the second insulating layer 520. The third insulating layer 530 may be disposed to cover one end of the first contact electrode 261 on the top surface of the second insulating layer 520. Accordingly, the third insulating layer 530 may protect the first contact electrode 261 and electrically insulate the first contact electrode 261 from the second contact electrode 262.

One end of the third insulating layer 530 that is oriented to the second electrode 220 may be aligned with one side surface of the second insulating layer 520.

Meanwhile, in some embodiments, the third insulating layer 530 may be omitted in the display device 10. Accordingly, the first contact electrode 261 and the second contact electrode 262 may be disposed on substantially the same plane, and may be electrically insulated from each other by a passivation layer 550 to be described later.

The passivation layer 550 may be formed on the third insulating layer 530 and the second contact electrode 262 to protect members disposed on the insulating substrate layer 200 against the external environment. When the first contact electrode 261 and the second contact electrode 262 are exposed, a problem of disconnection of the contact electrode material may occur due to electrode damage, so it is required to cover them with the passivation layer 550. That is, the passivation layer 550 may be disposed to cover the first electrode 210, the second electrode 220, the light emitting element 300, and the like. In addition, as described above, when the third insulating layer 530 is omitted, the passivation layer 550 may be formed on the first contact electrode 261 and the second contact electrode 262. In this case, the passivation layer 550 may electrically insulate the first contact electrode 261 and the second contact electrode 262 from each other.

Each of the above-described first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include a material such as silicon oxide (SiOx), silicon nitride (SiNx), silicon oxynitride (SiOxNy), aluminum oxide ($Al_2O_3$), aluminum nitride (AlN), and the like. The first insulating layer 510, the second insulating layer 520, the third insulating layer 530, and the passivation layer 550 may be made of the same material, but may also be made of different materials. In addition, various materials that impart insulating properties to the first insulating layer 510, the second insulating layer 520, the third insulating layer 530, and the passivation layer 550 are applicable.

Meanwhile, the first and second insulating layers 510 and 520 may differ in etch selectivity as described above. As one example, when the first insulating layer 510 includes silicon oxide (SiOx), the second insulating layer 520 may include silicon nitride (SiNx). As another example, when the first insulating layer 510 includes silicon nitride (SiNx), the second insulating layer 520 may include silicon oxide (SiOx). However, the present disclosure is not limited thereto.

Meanwhile, the light emitting element 300 may be manufactured on a substrate by epitaxial growth. A seed crystal layer for forming a semiconductor layer may be formed on the substrate, and a desired semiconductor material may be deposited to grow. Hereinafter, the structure of the light emitting element 300 according to various embodiments will be described in detail with reference to FIG. 3.

Figure 3B:
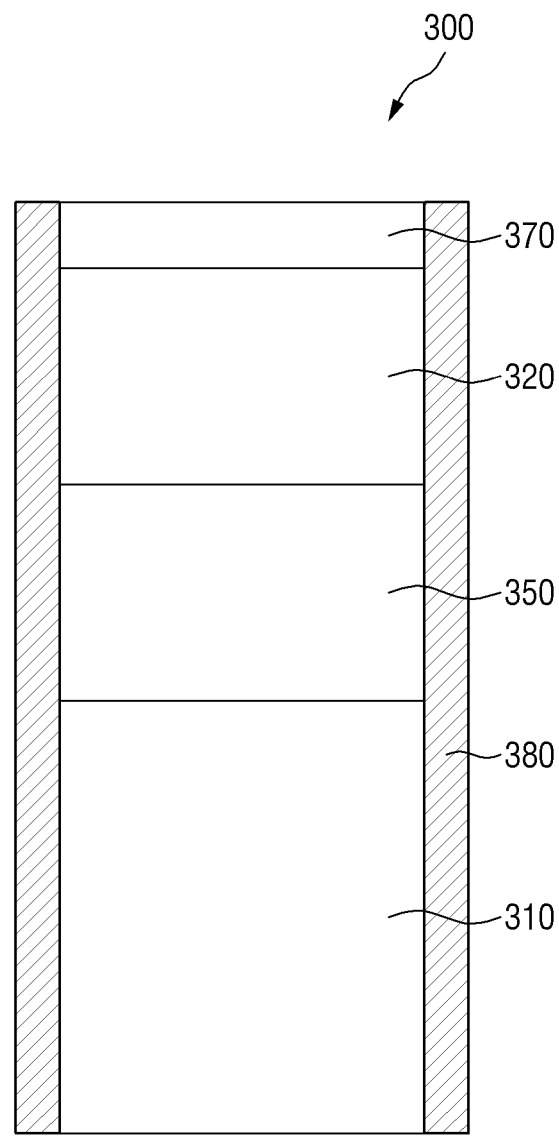
FIG. 3B is a cross-sectional view taken along line 3b-3b' of FIG. 3A.

FIG. 3A is a schematic diagram of a light emitting element according to an embodiment. FIG. 3B is a cross-sectional view taken along line 3b-3b' of FIG. 3A.

With reference to FIG. 3, the light emitting element 300 may include a plurality of conductivity type semiconductors 310 and 320, an element active layer 330 arranged between the plurality of conductivity type semiconductors 310 and 320, an electrode material layer 370, and an insulating material layer 380. The electrical signal received through the first and second electrodes 210 and 220 may be transferred to the element active layer 330 via the plurality of conductivity type semiconductors 310 and 320 to emit light.

In detail, the light emitting element 300 may include the first conductivity type semiconductor 310, the second conductivity type semiconductor 320, the element active layer 330 arranged between the first and second conductivity type semiconductors 310 and 320, the electrode material layer 370 arranged on the second conductivity type semiconductor 320, and the insulating material layer 380. Although it is shown in FIG. 3A that the light emitting element 300 has a layered structure in which the first conductivity type semiconductor 310, the element active layer 330, the second conductivity type semiconductor 320, and the electrode material layer 370 are deposited in order in the lengthwise direction thereof, the present disclosure is not limited thereto. The electrode material layer 370 may be omitted and, in some embodiments, it may be arranged on at least one of both side surfaces of each of the first and second conductivity type semiconductor 310 and 320. Hereinafter, a description is made of the exemplary light emitting element 300 of FIG. 3A, and it is obvious that the following description of the light emitting element 300 is identically applicable to light emitting elements 300 including different structures.

The first conductivity type semiconductor 310 may be an n-type semiconductor layer. As one example, when the light emitting element 300 emits light of a blue wavelength band, the first conductivity type semiconductor 310 may include a semiconductor material having a chemical formula of $In_xAl_yGa_{1-x-y}N$ ($0 \leq x \leq 1$, $0 \leq y \leq 1$, $0 \leq x+y \leq 1$). For example, it may be any one or more of n-type doped InAlGaN, GaN, AlGaN, InGaN, AlN and InN. The first conductivity type semiconductor 310 may be doped with a first conductive dopant. For example, the first conductive dopant may be Si, Ge, Sn, or the like. The length of the first conductivity type semiconductor 310 may have a range of 1.5 µm to 5 µm, but is not limited thereto.

The second conductivity type semiconductor 320 may be a p-type semiconductor layer. As one example, when the light emitting element 300 emits light of a blue wavelength band, the second conductivity type semiconductor 320 may include a semiconductor material having a chemical formula of $In_xAl_yGa_{1-x-y}N$ ($0 \leq x \leq 1$, $0 \leq y \leq 1$, $0 \leq x+y \leq 1$). For example, it may be any one or more of p-type doped InAlGaN, GaN, AlGaN, InGaN, AlN and InN. The second conductivity type semiconductor 320 may be doped with a second conductive dopant. For example, the second conductive dopant may be Mg, Zn, Ca, Se, Ba, or the like. The length of the second conductivity type semiconductor 320 may have a range of 0.08 µm to 0.25 µm, but is not limited thereto.

The element active layer 330 is disposed between the first conductivity type semiconductor 310 and the second conductivity type semiconductor 320, and may include a material having a single or multiple quantum well structure. When the element active layer 330 includes a material having a multiple quantum well structure, a plurality of quantum layers and well layers may be stacked alternately. The element active layer 330 may emit light by coupling of electron-hole pairs according to an electric signal applied through the first conductivity type semiconductor 310 and the second conductivity type semiconductor 320. For example, when the element active layer 330 emits light of a blue wavelength band, it may include a material such as AlGaN or AlInGaN. In particular, when the element active layer 330 has a multiple quantum well structure in which quantum layers and well layers may be stacked alternately, the quantum layer may include a material such as AlGaN or AlInGaN, and the well layer may include a material such as GaN or AlGaN. However, the present disclosure is not limited thereto, and the element active layer 330 may have a structure in which semiconductor materials having large band gap energy and semiconductor materials having small band gap energy are alternately stacked, and may include other Group III to V semiconductor materials according to the wavelength band of the emitted light. The light emitted by the element active layer 330 is not limited to light of a blue wavelength band, but may also emit light of a red or green wavelength band in some cases. The length of the element active layer 330 may have a range of 0.05 µm to 0.25 µm, but is not limited thereto.

The light emitted from the element active layer 330 may be projected through both side surfaces, as well as the outer surface of the light emitting element 300, in a longitudinal direction. The directionality of light emitted from the element active layer 330 is not limited to one direction.

The electrode material layer 370 may be an ohmic contact electrode. However, the present disclosure is not limited thereto, and the electrode material layer 370 may be a Schottky contact electrode. The electrode material layer 370 may include conductive metal. For example, the electrode material layer 370 may include at least one of aluminum (Al), titanium (Ti), indium (In), gold (Au), or silver (Ag). The electrode material layer 370 may include the same material or different materials. However, the present disclosure is not limited thereto.

The insulating material layer 380 may be formed outside the light emitting element 300 to protect the light emitting element 300. For example, the insulating material layer 380 may be formed to surround the side surface of the light emitting element 300, and may not be formed at both ends of the light emitting element 300 in the longitudinal direction, e.g., at both ends where the first conductivity type semiconductor 310 and the second conductivity type semiconductor 320 are disposed. However, the present disclosure is not limited thereto. The insulating material layer 380 may include materials having insulating properties, for example, silicon oxide (SiOx), silicon nitride (SiNx), silicon oxynitride (SiOxNy), aluminum nitride (AlN), aluminum oxide ($A_2O_3$), and the like. Accordingly, an electrical short circuit that may occur when the element active layer 330 directly contacts the first electrode 210 or the second electrode 220 can be prevented. Furthermore, the insulating material layer 380 includes the element active layer 330 to protect the outer surface of the light emitting element 300, which may prevent degradation in light emission efficiency.

The insulating material layer 380 may be formed to extend in the lengthwise direction to cover the first conductivity type semiconductor 310 to the electrode material layer 370. However, the present disclosure is not limited thereto, and the insulating material layer 380 may cover only the first conductivity type semiconductor 310, the element active layer 330, and the second conductivity type semiconductor 320, or only part of the outer surface of the electrode material layer 370 and expose part of the outer surface of the electrode material layer 370.

In some embodiments, the insulating material layer 380 may be surface-processed so as to disperse rather than to cohere with other insulating material layers 380 in a solution. In this case, the light emitting element 300 may remain in a dispersed state in the solution to be aligned independently between the first and second electrodes 210 and 220 during the alignment of the light emitting element 300 as to be described later. For example, the insulating material layer 380 may be surface-processed in a hydrophobic or hydrophilic manner, such that the light emitting elements 300 remain in a mutually dispersed state in the solution.

The thickness of the insulating material layer 380 may have a range of 0.5 µm to 1.5 µm, but is not limited thereto.

The light emitting element 300 may have a cylindrical shape. As shown in FIG. 3B, the cross section taken by halving the light emitting element 300 in the lengthwise direction crossing the two ends of the light emitting element 300 may have a rectangular shape. However, the shape of the light emitting element 300 is not limited thereto, and may have various shapes such as a regular cube, a rectangular parallelepiped and a hexagonal prism. The light emitting element 300 may have a length l of 1 µm to 10 µm or 2 µm to 5 µm, and preferably about 4 µm. In addition, the diameter of the light emitting element 300 may have a range of 400 nm to 700 nm, and preferably may be about 500 nm.

Although the following description is made of the exemplary light emitting element 300 shown in FIG. 3A for convenience of explanation, the present disclosure may be identically applicable to the light emitting elements including more electrode material layers 370 or other structures.

Figure 5:
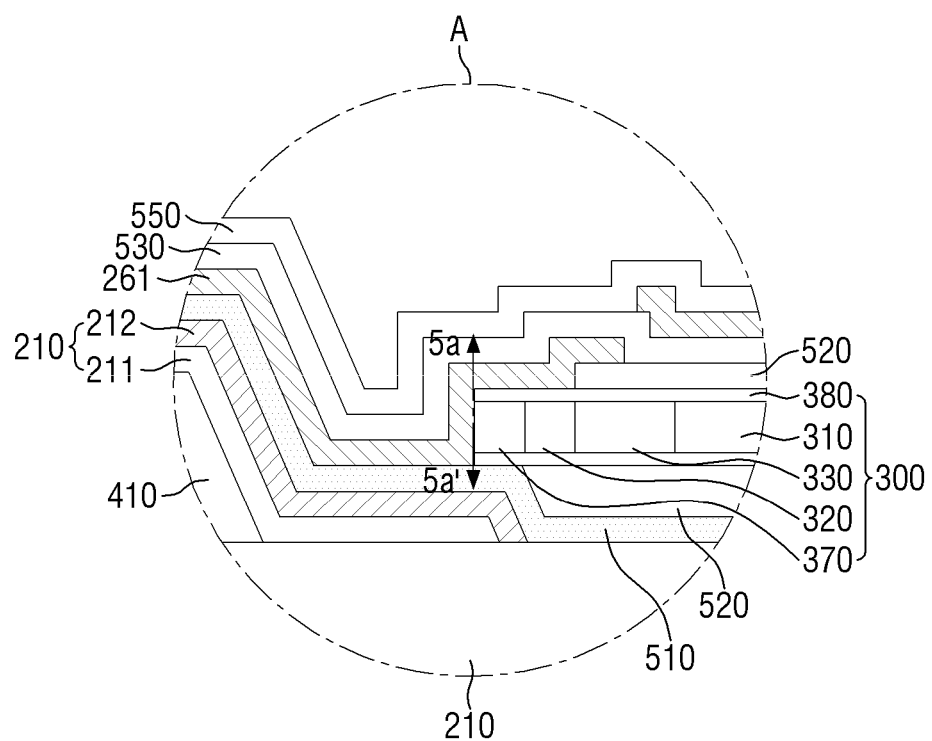
FIG. 5 is an enlarged view of part A of FIG. 2.

Meanwhile, FIG. 4 is an enlarged view of part of FIG. 3A, and FIG. 5 is an enlarged view of part A of FIG. 2.

With reference to FIG. 4, the light emitting element 300 according to an embodiment may have a parting surface 390 that is flat and relatively less rough. The light emitting element 300 may include the first conductivity type semiconductor 310 of which the end surface becomes the parting surface 390 in the manufacture of the light emitting element 300 as to be described later. The first conductivity type semiconductor 310 of the light emitting element 300 may be formed to have an even surface, which prevents an open circuit problem from occurring when contacting the first contact electrode 261.

With reference to FIG. 5, the shape of the parting surface 390 of the end of the light emitting element 300 may determine the contact quality on the plane (line 5a-5a' in FIG. 5) where the parting surface 390 of one end of the light emitting element 300 and a surface of the first contact electrode 261 contact each other. For example, if the parting surface 390 of the light emitting element 300 is rough or protruded, or recessed to form a slope, this may degrade the thin film step coverage of the contact electrode material when contacting the first contact electrode 261, which leads to a partial cutoff of the electrode material. That is, the faulty contact between the light emitting element 300 and the first contact electrode 261 at the contact area (5a-5a' of FIG. 5) may block an electrical signal from reaching the light emitting element 300, leading to a light emission error.

Meanwhile, if the parting surface 390 of the light emitting element 300 is even as shown in FIG. 5, this makes it possible to prevent a short circuit problem of the contact electrode material from occurring at the area (5a-5a' of FIG. 5) where the light emitting element 300 and the contact electrode 260 contact each other. This may be able to improve reliability of the light emitting element 300 of the display device 10. According to an embodiment, the parting surface 390 of the light emitting element 300 may have a roughness value of 8 nm Ra to 12 nm Ra. However, the present disclosure is not limited thereto. Meanwhile, although not shown in the drawing, the above-described approach may be identically applicable to the second conductivity semiconductor 320 contacting the second contact electrode 262, or the side surface formed by the electrode material layer 370.

The evenness of the parting surface 390 of the light emitting element 300 may be accomplished by separating the light emitting element 300 from a lower substrate layer on which the light emitting element 300 was grown in the process of manufacturing the light emitting element 300, in a way of peeling a separating layer 1300 (shown in FIG. 7) on which the light emitting element 300 was formed. That is, the light emitting element 300 may be separated from the lower substrate layer without any external physical force, by letting the material grown on the parting surface 390 of one end of the light emitting element 300 be cut off by peeling the separating layer 1300 on which the light emitting element 300 was grown.

In this manner, the light emitting element 300 according to an embodiment may be manufactured to have the both ends with the flat even parting surface 390 contacting the first and second contact electrodes 261 and 262, which makes it possible to prevent a short circuit problem from occurring with the material of the contact electrodes 261 and 262. A description is made hereinafter of the method for manufacturing the light emitting element 300 in detail with reference to FIGS. 6 to 18.

FIGS. 6 to 18 are schematic cross-sectional views schematically showing a method for manufacturing a light emitting element according to an embodiment.

Figure 6:
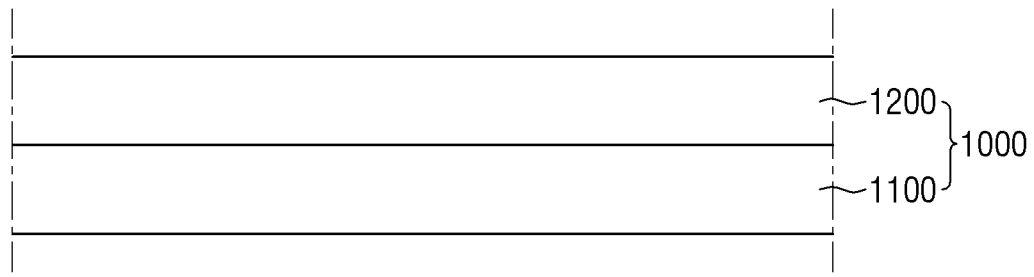
FIGS. 6 to 18 are schematic cross-sectional views schematically showing a method for manufacturing a light emitting element according to an embodiment.

First, with reference to FIG. 6, a lower substrate layer 1000 including a base substrate 1100 and a buffer material layer 1200 formed on the base substrate 1100 is prepared. As shown in FIG. 6, the lower substrate layer 1000 may have a layered structure formed by depositing the base substrate 1100 and the buffer material layer 1200 in order.

The base substrate 1100 may include a transparent substrate such as a sapphire ($Al_2O_3$) substrate and a glass substrate. However, the present disclosure is not limited thereto, and it may be formed of a conductive substrate material such as GaN, SiC, ZnO, Si, GaP and GaAs. The following description is directed to an exemplary case where the base substrate 1100 is a sapphire ($Al_2O_3$) substrate. Although not limited, the base substrate 1100 may have, for example, a thickness in the range of 400 μm to 1500 μm.

On the base substrate 1100, a plurality of conductivity type semiconductor layers are formed. The plurality of conductivity type semiconductor layers grown by an epitaxial growth method may be grown by forming a seed crystal and depositing a crystal material thereon. Here, the conductivity type semiconductor layer may be formed using one of electron beam deposition, physical vapor deposition (PVD), chemical vapor deposition (CVD), plasma laser deposition (PLD), dual-type thermal evaporation, sputtering, and metal organic chemical vapor deposition (MOCVD), preferably, using the metal organic chemical vapor deposition (MOCVD). However, the present disclosure is not limited thereto.

Typically, a precursor material for forming the plurality of conductivity type semiconductor layers may be selected to form a target material in a typically selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$. Hereinafter, with the omission of the description of the method and processing conditions for forming the plurality of conductivity type semiconductor layers, a description is made of the processing order of the method for manufacturing the light emitting element 300 and the layered structure of the light emitting element 300 in detail.

A buffer material layer 1200 is formed on the base substrate 1100. Although it is shown in the drawing that one buffer material layer 1200 is deposited, the present disclosure is not limited thereto, and a plurality of layers may be formed.

At a step to be described later, a separating layer 1300 may be disposed on the buffer material layer 1200 and then a crystal for the first conductivity type semiconductor layer 3100 may grow on the separating layer 1300. The buffer material layer 1200 may be interposed between the base substrate 1100 and the separating layer 1300 to reduce a grid constant difference of the first conductivity type semiconductor layer 3100. Although the first conductivity type semiconductor layer 3100 may be directly formed on the separating layer 1300 disposed on the base substrate 1100, the buffer material layer 1200 may provide the seed crystal to facilitate crystal growth to the first conductivity type semiconductor layer 3100.

For example, the buffer material layer 1200 may include an undoped semiconductor, and may be a material including substantially the same material as the first conductivity type semiconductor layer 3100 that is neither n-type doped nor p-type doped. In an exemplary embodiment, the buffer material layer 1200 may be, but is not limited to, at least one of undoped InAlGaN, GaN, AlGaN, InGaN, AlN, or InN.

Meanwhile, in some embodiments, a plurality of layers may be formed on the buffer material layer 1200, and the separating layer 1300 may be deposed thereon. The buffer material layer 1200 may also be omitted, depending on the base substrate 1100. A detailed description thereof will be given with reference to other embodiments. Hereinafter, a description is made of the exemplary case where the buffer material layer 1200 including an undoped semiconductor material is formed on the base substrate 1100.

Figure 7:
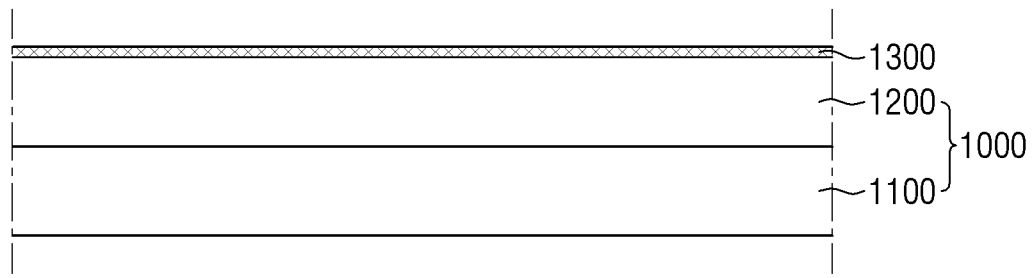

Next, with reference to FIG. 7, the separating layer 1300 is formed on the lower substrate layer 1000.

The separating layer 1300 may have the first conductivity type semiconductor layer 3100 formed thereon. That is, the separating layer 1300 may be interposed between the first conductivity type semiconductor layer 3100 and the buffer material layer 1200, and the separating layer 1300 may include a material facilitating growth of the crystal of the first conductivity type semiconductor layer 3100. The separating layer 1300 may be peeled off from the lower substrate layer 1000 to separate the light emitting element 300 manufactured thereon at a step to be described later.

In an exemplary embodiment, the separating layer 1300 may include a graphene layer. The graphene may facilitate crystal growth of the conductivity type semiconductor layer due to the nature of surface characteristics thereof. Particularly in the case of pure graphene that barely includes graphene oxide (GO) as an impurity, conductivity type semiconductors may grow in the epitaxial process for manufacturing the light emitting element 300.

The graphene layer may have a two-dimensional plane single layer structure of carbon atoms, which forms a relatively weak mutual attraction between layers. That is, the graphene layer may be disposed on an interface between two different material layers to facilitate peeling one material layer off from the other material layer. That is, the separating layer 1300 including the graphene layer may be disposed on the interface between the buffer material layer 1200 and the first conductivity type semiconductor layer 3100 to facilitate separating the manufactured light emitting element 300.

For example, the separating layer 1300 may have a structure formed with a single pure graphene layer or two laminated graphene layers. Although it is shown in FIG. 7 that the separating layer 1300 includes a single graphene layer, the separating layer 1300 may have a structure of two laminated graphene layers in some cases. As a consequence, in the separation process of the light emitting element 300 to be described later, the separating layer 1300 and the first conductivity type semiconductor layer 3100 may be separated on the interface therebetween, or between the plurality of graphene layers constituting the separating layer 1300. In an exemplary embodiment, the separating layer 1300 may have a thickness in a range from 0.3 nm to 1.0 nm. The single graphene layer may have a thickness of about 0.35 nm. Accordingly, the separating layer 1300 composed of one or two graphene layers may have a thickness in the aforementioned range. A more detailed description thereof is made later, and a description is made hereinafter of the exemplary case where the separating layer 1300 includes a single graphene layer.

The separating layer 1300 may also serve as an etching stopper between an element deposition structure 3000 and the buffer material layer 1200 during the process of etching the element deposition structure 3000. That is, when the element deposition structure 3000 is etched, the separating layer 1300 may be patterned simultaneously in one process or patterned separately in a different process. There is no limitation on the method of manufacturing the light emitting element 300.

However, the present disclosure is not limited thereto, and more separating layers 1300 may be arranged in the element deposition structure 3000 or the lower substrate layer 1000, and regions such as on the interface between the buffer material layer 1200 and the first conductivity type semiconductor layer 1300. A detailed description thereof will be given with reference to other embodiments.

Figure 8:
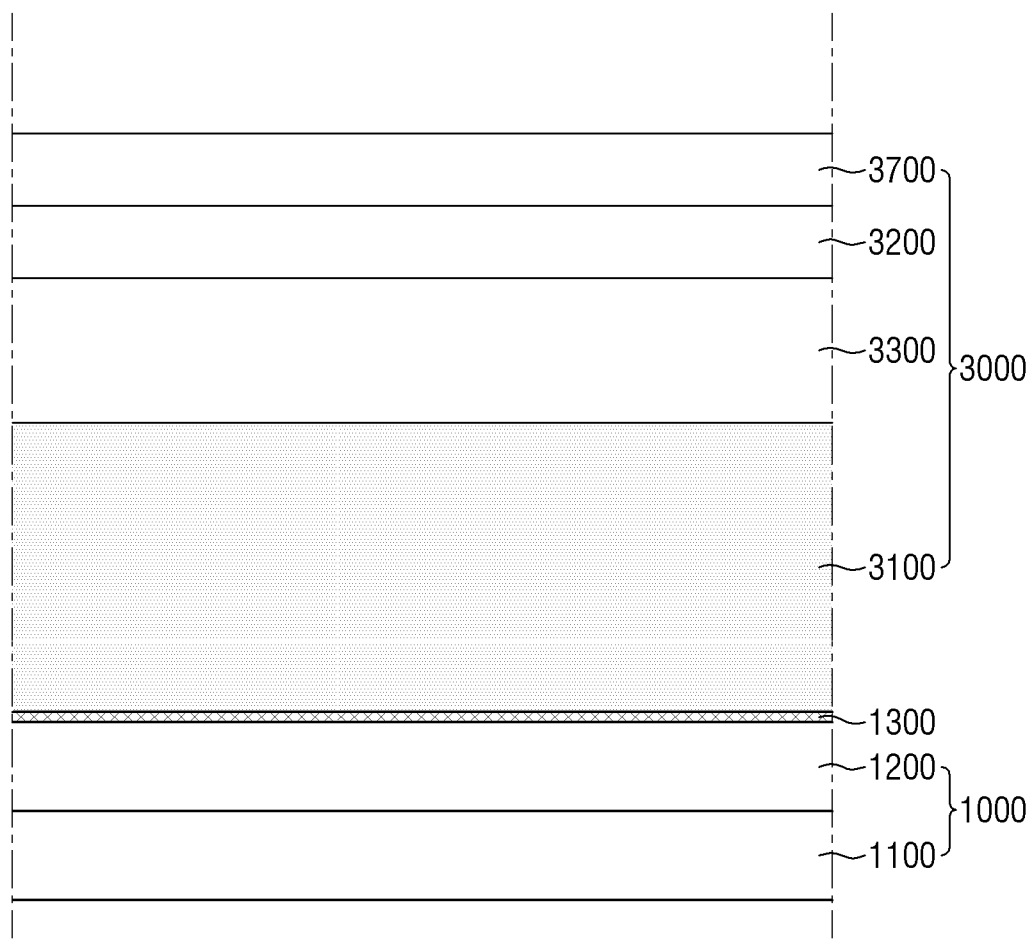

Next, with reference to FIG. 8, the element deposition structure 3000 is formed by depositing a first conductivity type semiconductor layer 3100, an active material layer 3300, a second conductivity type semiconductor layer 3200, and a conductive electrode material layer 3700 in order on the separating layer 1300.

The element deposition structure 3000 may be partially etched to form the light emitting element 300 in a step to be described later. The plurality of material layers included in the element deposition structure 3000 may be formed through a conventional process as described above. On the separating layer 1300, the first conductivity type semiconductor layer 3100, the active material layer 3300, the second conductivity type semiconductor layer 3200, and the conductive electrode material layer 3700 may be deposited in order, and they may respectively include the same materials as those of the first conductivity type semiconductor 310, the element active layer 330, the second conductivity type semiconductor 320, and the electrode material layer 370 of the light emitting element 300.

Figure 11:
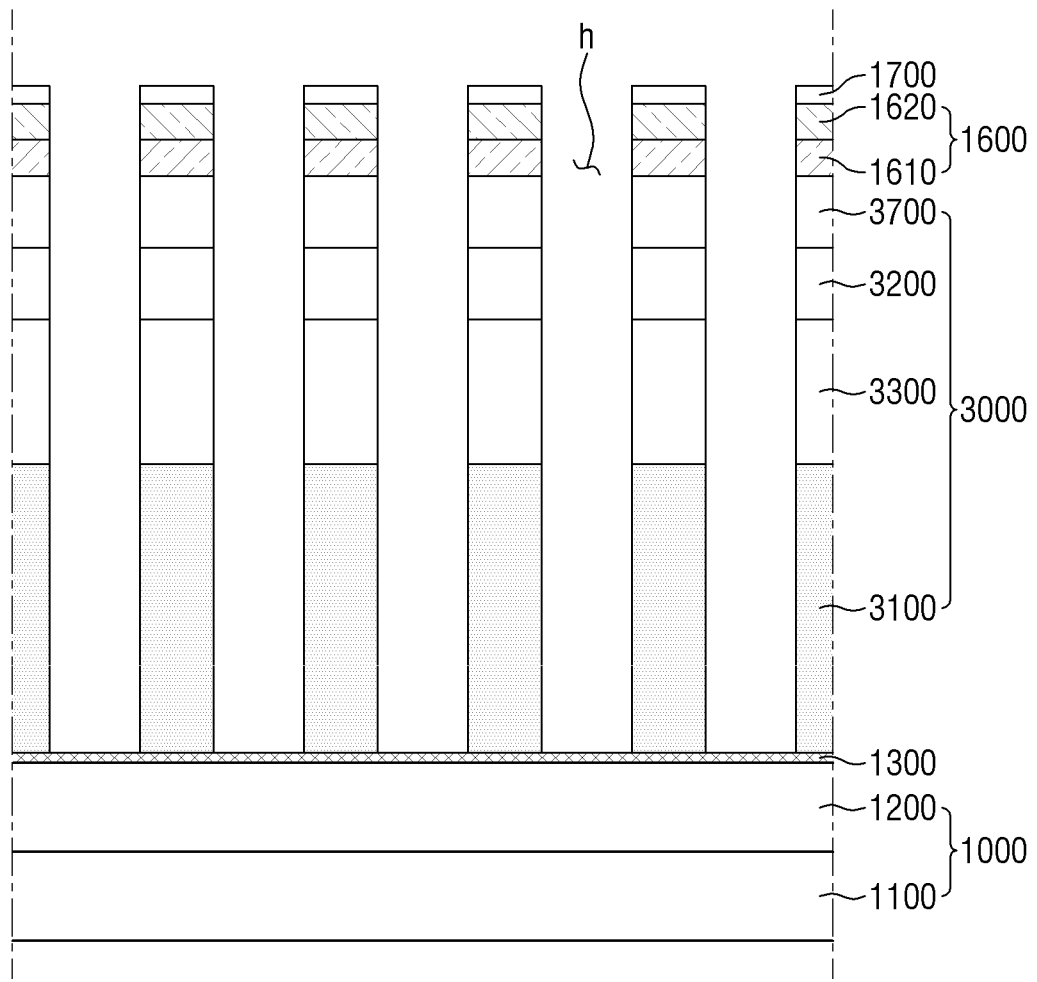

Meanwhile, the light emitting element 300 may be manufactured with the omission of the electrode material layer 370, or with the further inclusion of a different electrode material layer 370 formed on the bottom surface of the first conductivity type semiconductor 310. That is, the conductive electrode material layer 3700 formed on the second conductivity type semiconductor layer 3200 may be omitted as shown in FIG. 11. The following description is made of the exemplary case where the element deposition structure 3000 includes the conductive electrode material layer 3700.

Next, with reference to FIGS. 9 to 12, the light emitting element 300 may be manufactured in a way of etching the element deposition structure 3000 in the vertical direction to form an element rod ROD and then forming an insulating layer 3800 partially covering the outer surface of the element rod ROD.

Figure 9:
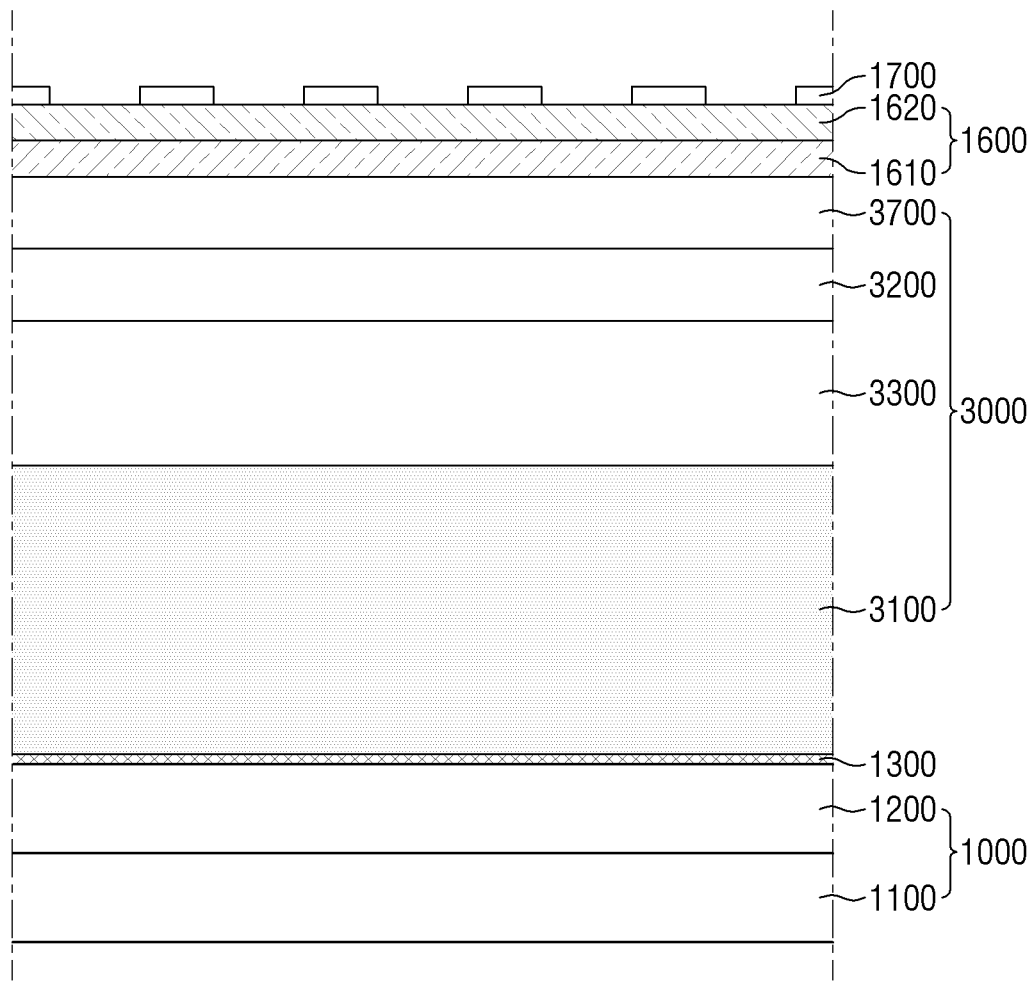
Figure 10:
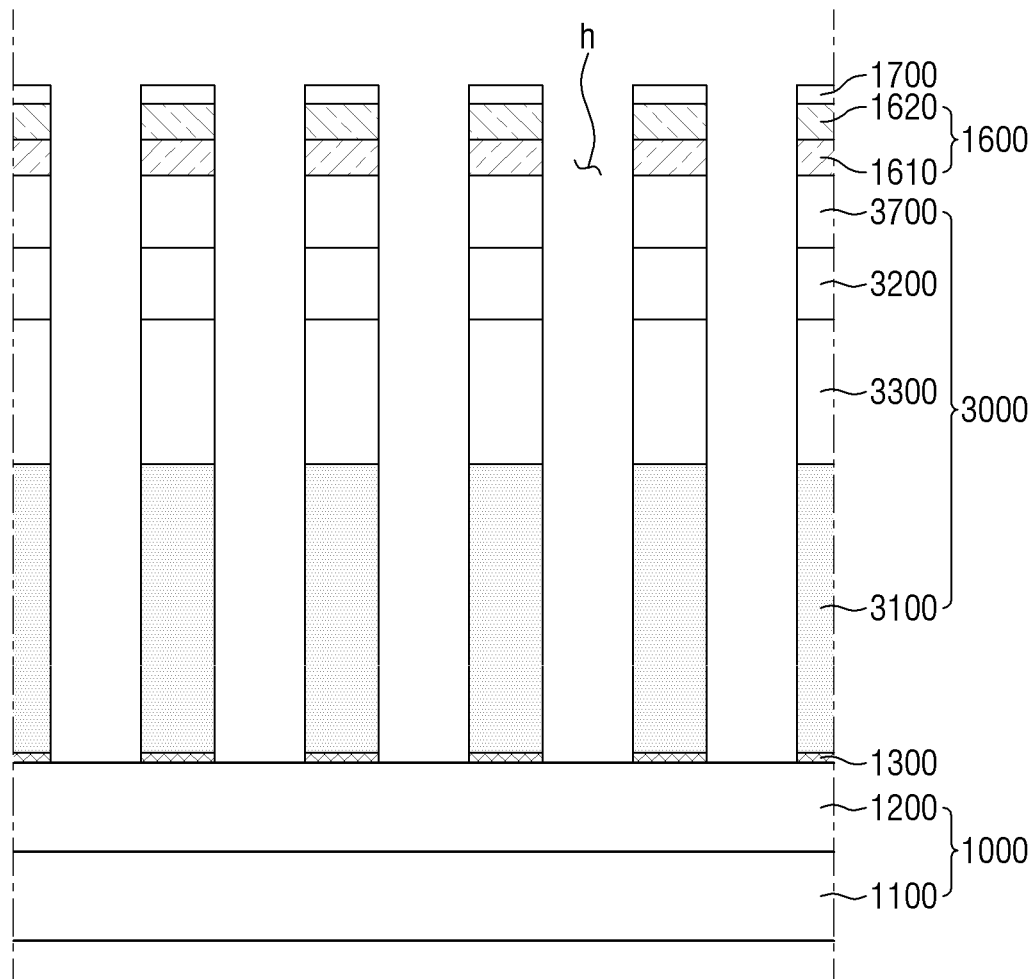

First, with reference to FIGS. 9 and 10, forming the element rod ROD by vertically etching the element deposition structure 3000 may include a patterning process that may be conventionally carried out. For example, forming the element rod ROD by etching the element deposition structure 300 may include forming an etching mask layer 1600 and an etching pattern layer 1700 on the element deposition structure 3000, and etching the element deposition structure 3000 according to a pattern of the etching pattern layer 1700, and removing the etching mask layer 1600 and the etching pattern layer 1700.

The etching mask layer 1600 may serve as a mask for consecutively etching the first conductivity type semiconductor layer 3100, the active material layer 3300, the second conductivity type semiconductor layer 3200, and the conductive electrode material layer 3700 of the element deposition structure 3000. The etching mask layer 1600 may include a first etching mask layer 1610 including an insulating material, and a second etching mask layer 1620 including metal.

The insulating material included in the first etching mask layer 1610 of the etching mask layer 1600 may be an oxide or a nitride. Examples of the insulating material may include silicon oxide ($SiO_x$), silicon nitride ($SiN_x$), and silicon oxynitride ($SiO_xN_y$). The first etching mask layer 1610 may have a thickness in the range of 0.5 μm to 1.5 μm without being limited thereto.

The second etching mask layer 1620 may not be limited in material as long as it can serve as a mask for consecutively etching the element deposition structure 3000. For example, the second etching mask layer 1620 may include chrome (Cr).

The second etching mask 1620 may have a thickness in the range from 30 nm to 150 nm without being limited thereto.

The etching pattern layer 1700 formed on the etching mask layer 1600 may include at least one nanopattern separated from each other thereon. The etching pattern layer 1700 may serve as a mask for consecutively etching the element deposition structure 3000. There is no limitation on the etching method as long as it can form a pattern including a polymer, a polyethylene sphere, or a silica sphere on the etching pattern layer 1700.

For example, in the case where the etching pattern layer 1700 includes a polymer, it may be possible to employ a conventional method for forming a pattern with the polymer. For example, it may be possible to use a method such as photolithography, e-beam lithography, nanoimprint lithography to form the etching pattern layer 1700 including the polymer.

Particularly, the structure, shape, and separation interval of the etching pattern layer 1700 may be associated with the shape of the finally manufactured light emitting element 300. However, because the light emitting element 300 may have a different shape as described above, the etching pattern layer 1700 is not particularly limited in structure. For example, if the etching pattern layer 1700 has a pattern of circles separated from each other, the element deposition structure 300 may be vertically etched to manufacture the light emitting element 300 having a cylinder shape. However, the present disclosure is not limited thereto.

Next, the element deposition structure 3000 may be etched according to the pattern of the etching pattern layer 17000 to form the element rod ROD. The spaces between the plurality of nanopatterns in the etching pattern layer 1700 may be vertically etched to form a hole, which is selectively formed to have a depth from the etching mask layer 1600 to the separating layer 1300.

The hole may be formed using a conventional method. For example, the etching process may be performed with dry etching, wet etching, reactive ion etching (RIE), inductively coupled plasma reactive ion etching (ICP-RIE), or the like. The dry etching is capable of anisotropic etching, which may be appropriate for forming a hole through vertical etching. In the case of using the aforementioned etching technique, it may be possible to use $Cl_2$ or $O_2$ as etchant. However, the present disclosure is not limited thereto.

In some embodiments, etching the element deposition structure 3000 may be carried out with a combination of the dry etching and the wet etching. For example, it may be possible to perform etching in a depth direction with the dry etching, and then anisotropic etching with the wet etching, such that the etched sidewalls are placed on the plane perpendicular to the surface.

Meanwhile, forming the element rod ROD by etching the element deposition structure 3000 may include patterning the separating layer 1300 together during one etching process, or patterning part of the separating layer 1300 after the element rod ROD is formed through another etching process.

That is, the separating layer 1300 may be patterned together in the etching process of forming the hole by etching the element deposition structure 3000, or patterned in a separate process after acting as an etching stopper in the process of etching the element deposition structure 3000.

For example, in the case where the etchant for use in patterning the element deposition structure 3000 includes substance for removing the separating layer 1300, the element deposition structure 3000 and the separating layer 1300 may be simultaneously patterned in one process. On the other hand, with reference to FIG. 11, if the etchant is prepared for etching only the element deposition structure 3000, the separating layer 1300 may serve as an etching stopper such that the etchant etches only the element deposition structure and does etch the separating layer 1300. Accordingly, the element rod ROD may be formed in the state where the separating layer 1300 is not etched, and the separating layer 1300 may be patterned through a different etching process.

In some embodiments, if the separating layer 1300 includes a graphene layer and the etchant includes oxygen gas ($O_2$), it may be possible to simultaneously pattern the element deposition structure 3000 and the separating layer 1300. In another embodiment, if the etchant does not include oxygen gas ($O_2$), the element rod ROD may be formed by patterning the element deposition structure 3000, and the separating layer 1300 may be selectively etched in another etching process.

Figure 12:
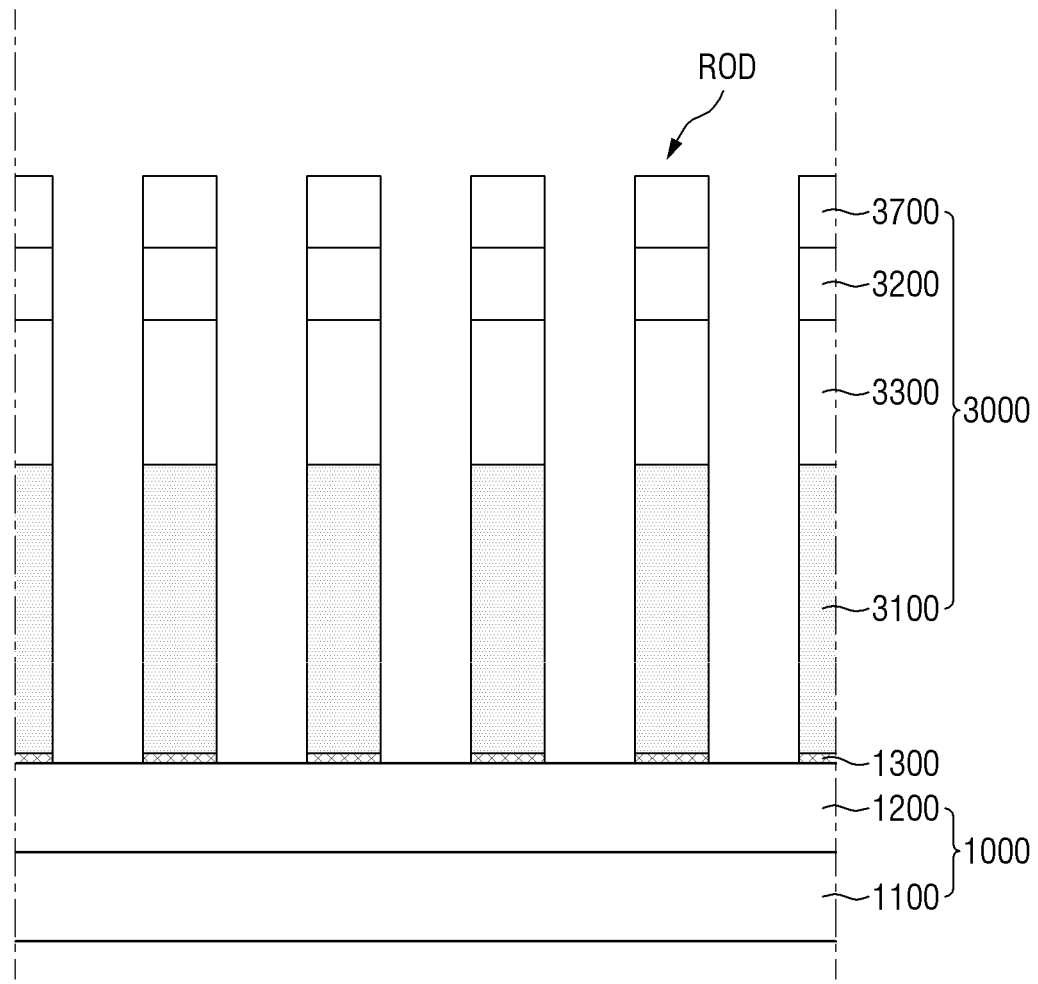

As described with reference to FIG. 12, the mask layer 1600 and the etching pattern layer 1700 remaining on the vertically etched element deposition structure 3000 may be removed by a conventional method, e.g., dry etching and wet etching, to form the element rod ROD.

Figure 13:
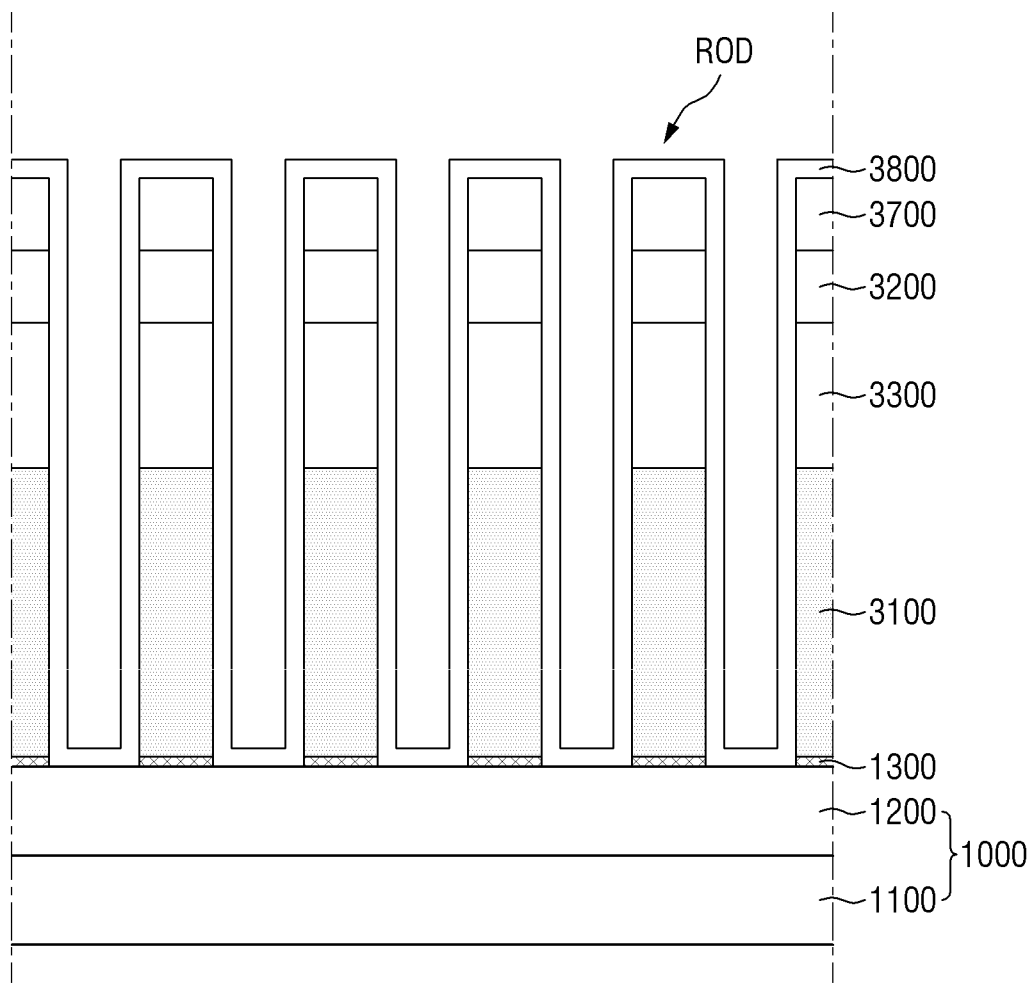
Figure 14:
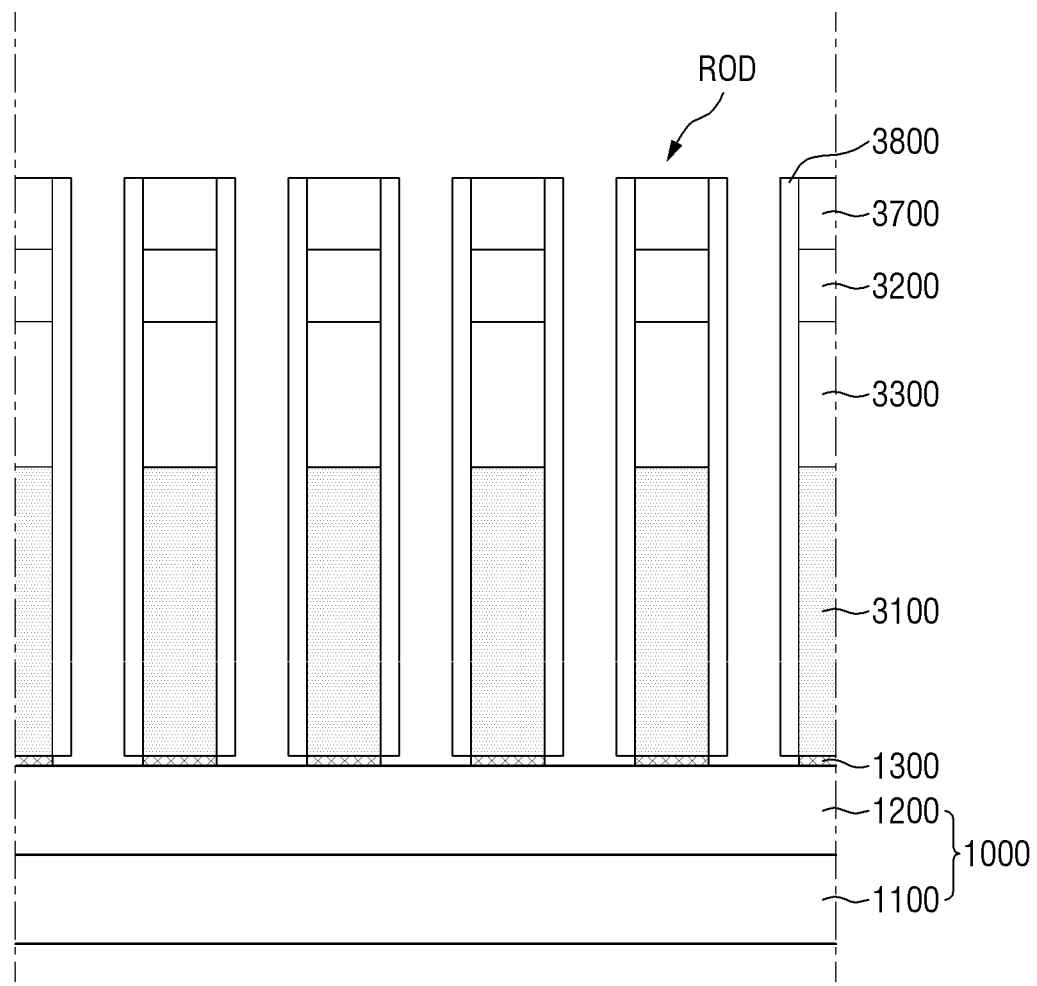

Next, with reference to FIGS. 13 and 14, the insulating layer 3800 may be formed to partially cover the outer surface of the element rod ROD to manufacture the light emitting element 300.

The insulating layer 3800 is an insulating material formed on the outer surface of the element rod ROD and may be formed by depositing the insulating material on the outer surface of the vertically etched element rod ROD or dipping the element rod ROD in the insulating material without being limited thereto. For example, the insulating layer 3800 may be formed using atomic layer deposition (ALD). The insulating layer 3800 may form an insulating material layer 380 of the light emitting element 300. As described above, the insulating layer 3800 may include a material such as silicon oxide (SiOx), silicon nitride (SiNx), silicon oxynitride (SiOxNy), aluminum oxide ($Al_2O_3$), and aluminum nitride (AlN).

With reference to FIG. 13, the insulating layer 3800 may be formed on the side and top surfaces of the element rod ROD, and between the buffer material layer 1200 and the separating layer 1300 exposed to the outside in the course of etching to form the elements rods ROD separately. In order to expose both end side surfaces of the element rod ROD, the insulating layer 3800 formed on the top surface of the element rod ROD may be removed. Accordingly, it may be necessary to partially remove the insulating layer 3800 formed in a direction perpendicular to the lengthwise direction of the element rod ROD, i.e., the direction parallel with the base substrate 1100. That is, as shown in FIG. 14, the top surface of the element rod ROD may be exposed by removing the insulating layer 3800 at least on the top surface of the element rod ROD, and between the buffer material layer 1200 and the separating layer 1300. In order to accomplish this, a process such as dry etching as anisotropic etching, or etch-back, may be performed. Through the above-described process, it may be possible to manufacture the light emitting element 300 including the insulating layer 3800 covering the outer surface of the element rod ROD.

Figure 15:
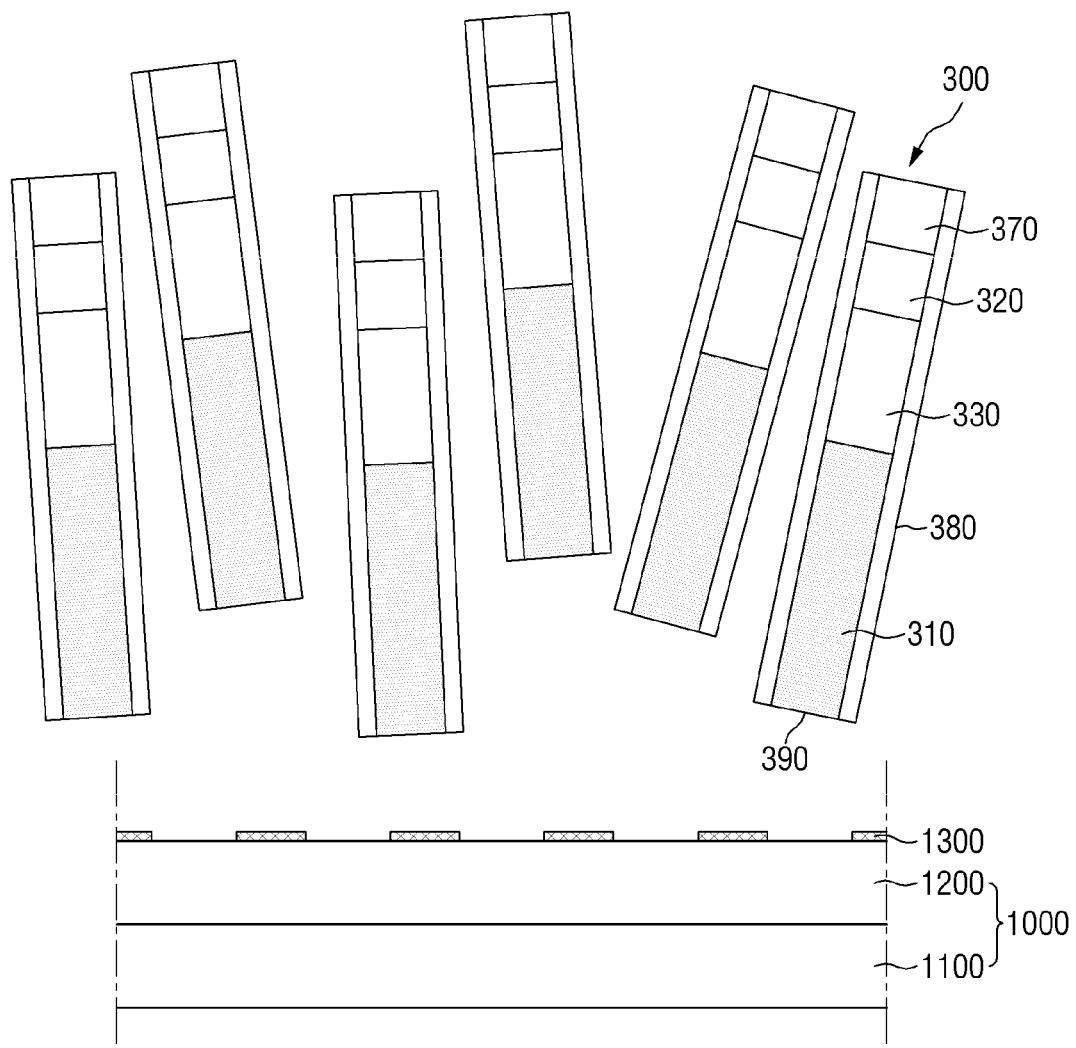

Finally, as shown in FIG. 15, the light emitting element 300 may be separated from the separating layer 1300 formed on the lower substrate layer 1000.

As described above, the separating layer 1300 including the graphene layer may form a relatively weak attractive force on the interface between different material layers. However, the separating layer 1300 may form a relatively strong attractive force with one of the different material layers and a relatively weak attractive force with another material layer. In this case, in the case where the separating layer 1300 is peeled off such that the two material layers are separated, the separating layer 1300 may remain on one of the two material layers.

In a method for manufacturing the light emitting element 300 according to an embodiment, the separating layer 1300 may have an interface attractive force with the buffer material layer 1200 that is greater than another interface attractive force with the first conductivity type semiconductor layer 3100. That is, when the manufactured light emitting element 300 is separated, the separating layer 1300 may remain on the buffer material layer 1200 with the relatively storing attractive force, and the first conductivity type semiconductor layer 3100 may be peeled off such that the light emitting element 300 is separated. Here, when the first conductivity type semiconductor layer 3100 is peeled off from the separating layer 1300, because the inter-crystal attractive force of the first conductivity type semiconductor layer 3100 is stronger than the interface attractive force associated with the separating layer 1300, the first conductivity type semiconductor layer 3100 may be separated from the lower substrate layer 1000 without any damage.

In this respect, the separating layer 1300 is peeled off on the parting surface 390 of the manufactured light emitting element 300, which makes it possible for the parting surface 390 to remain even, and simultaneously to secure uniformity of the parting surfaces 390 of the plurality of light emitting elements 300.

Meanwhile, there is no limitation on the method for separating the light emitting element 300 by peeling off the separating layer 1300. In some embodiments, the light emitting element 300 may be separated from the lower substrate layer 1000 through physical separation (Mechanically Lift Off) or chemical separation (Chemically Lift Off).

Figure 16:
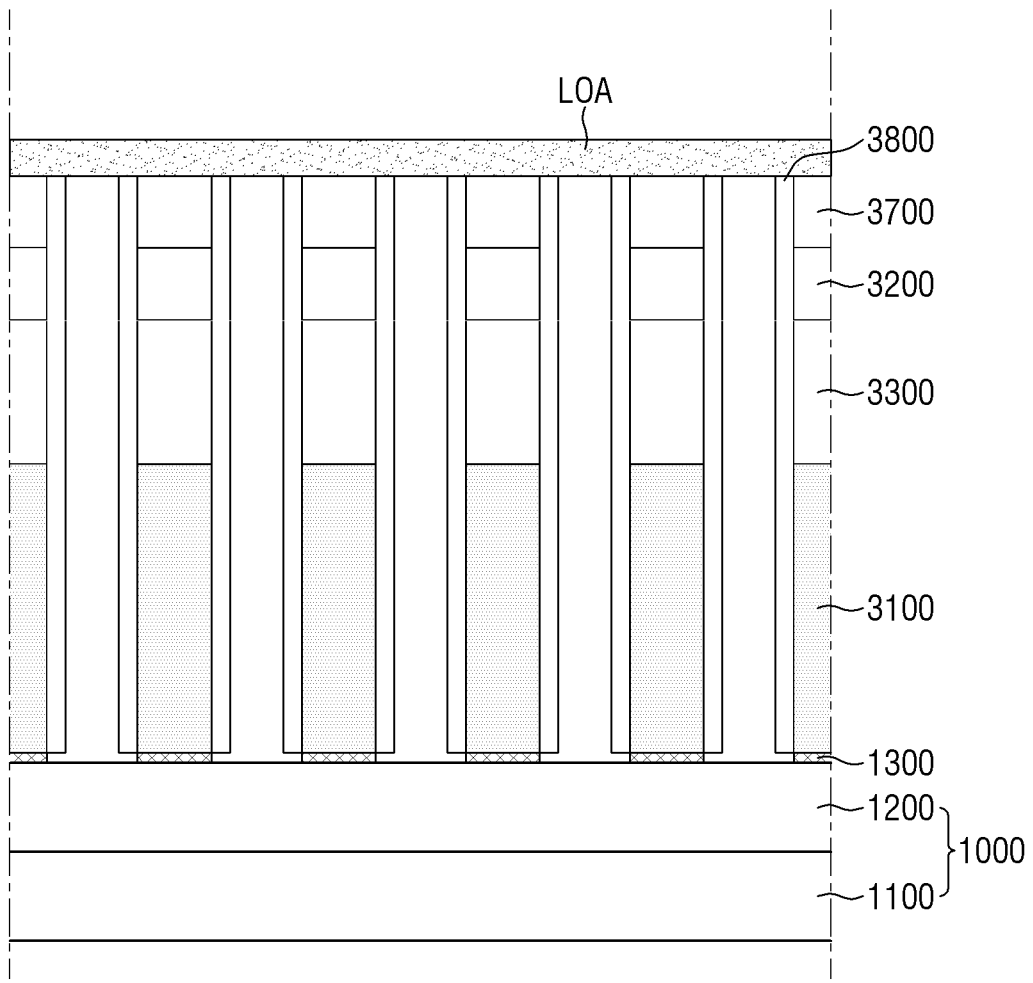
Figure 17:
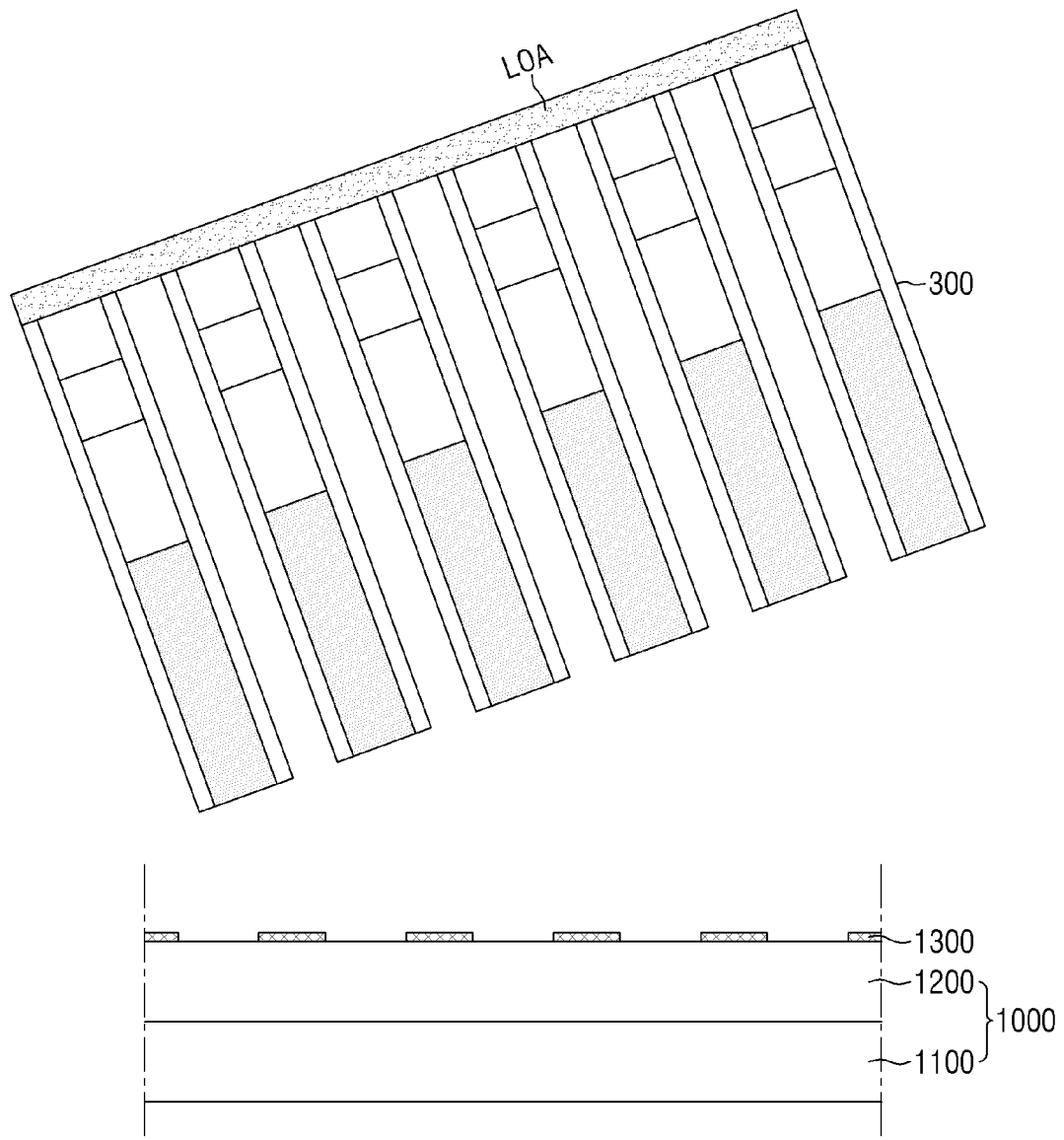
Figure 18:
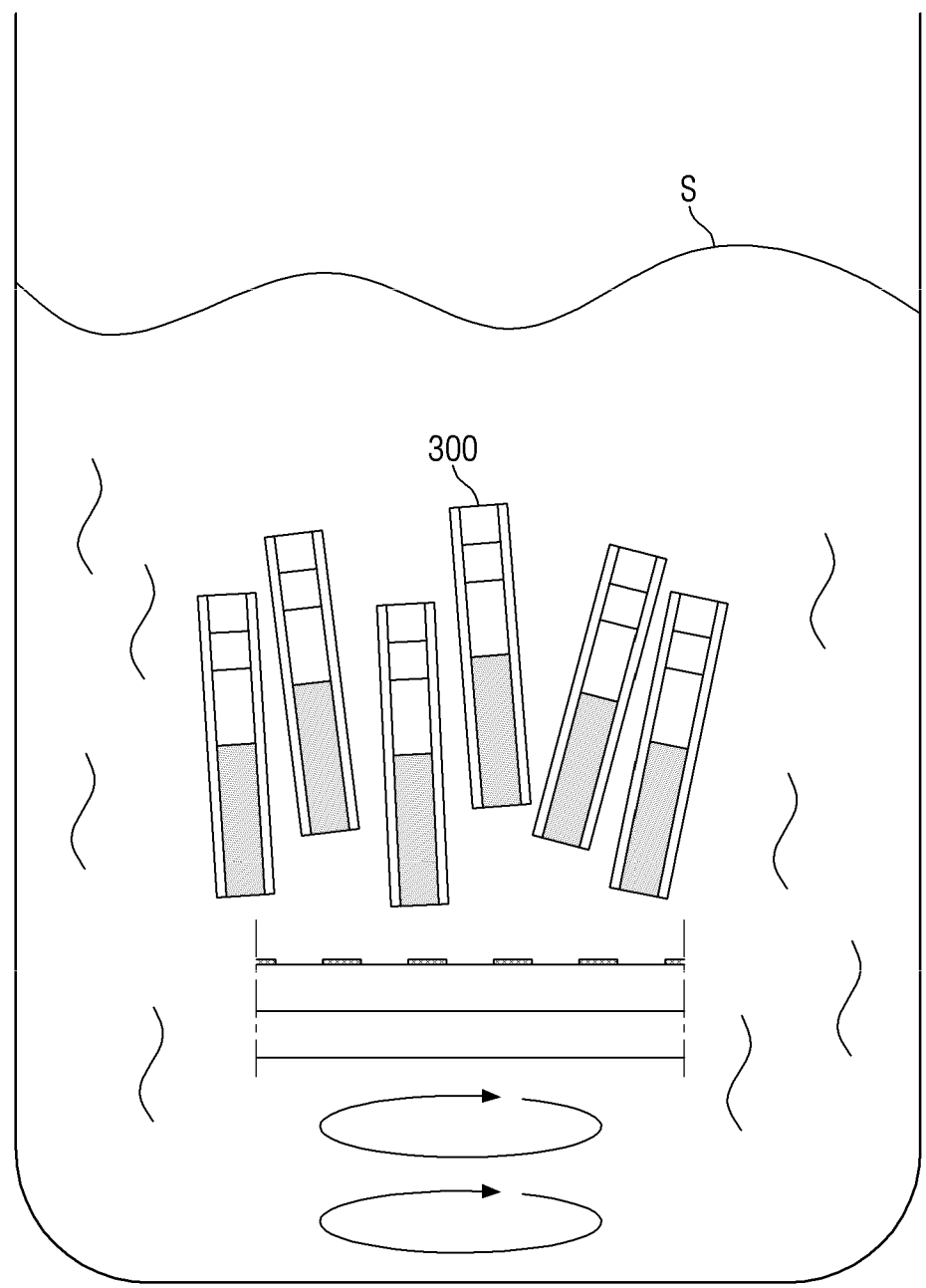

FIGS. 16 to 18 are schematic views showing a method for separating the light emitting element 300 according to an embodiment.

First, with reference to FIGS. 16 and 17, an adhesive layer LOA is formed on the top surfaces of the light emitting elements 300 manufactured on the lower substrate layer 1000. The adhesive layer LOA may be a material layer having adhesive components, and is not limited as long as it incurs no damage to the material of the light emitting element 300. Examples of the adhesive layer LOA may include, but are not limited to, polymethylmethacrylate (PMMA), polydimethylsiloxane (PMDS), viscosity variation film, and thermal release tape (TRT).

The plurality of light emitting elements 300 manufactured on the lower substrate layer 1000 may be simultaneously adhered, on the top surfaces thereof, to the adhesive layer LOA and physically lifted, as shown in FIG. 17, in order for the separating layer 1300 to be peeled off from the lower substrate layer 1000. Although not shown in the drawing, the adhesive layer LOA may be removed by a conventional method.

In another embodiment, the light emitting elements 300 may be separated from the lower substrate layer 1000 by a vibration in a solution. With reference to FIG. 18, the light emitting elements 300 manufactured on the separating layer 1300 may be separated in a way of applying a vibration in the state of being immerged in a separation solution S together with the lower substrate layer 1000. As described above, because the interface attractive force of the separating layer 1300 including the graphene layer is relatively weak, the separating layer 1300 may be peeled off by a relatively weak vibration. Accordingly, the light emitting elements 300 may be separated from the lower substrate layer 1000 by immerging them in the separation solution S and applying a vibration thereto. The separation solution S is not limited in kind as long as it incurs no damage to the light emitting element 300. Examples of the separation solution S may include an organic solvent. The method for separating the light emitting elements 300 is not limited by any of the steps described with reference to FIGS. 16 to 18. Although not shown in the drawings, the light emitting elements 300 may also be manufactured by chemically dissolving the separating layer 1300.

The method for manufacturing the light emitting elements 300 according to an embodiment may include forming the separating layer 1300 on the lower substrate layer 1000, and separating the light emitting elements 300 grown on the separating layer 1300 from the lower substrate layer 1000. The separating layer 1300 may include at least one graphene layer, which may facilitate separating the light emitting elements 300 manufactured thereon from the separating layer 1300 with a relatively weak interface attractive force. Because the attractive force between the separating layer 1300 and the first conductivity type semiconductor layer 3100 of the light emitting element 300 is weaker than the inter-crystal attractive force of the first conductivity type semiconductor layer 3100, the light emitting elements 300 may be separated with no damage on the parting surface 390 thereof, while the parting surface 390 remains even. This makes it possible to prevent an open circuit of the contact electrode material from occurring at the interface (e.g., parting surface 390) at which the light emitting element 300 and the contact electrode 260 contact each other, which leads to improvement of light emission reliability of the display device 10.

Meanwhile, the arrangement of the separating layer 1300 is not limited to the arrangement shown in FIG. 7. As described above, in the process of manufacturing the light emitting elements 300, one or more separating layers 1300 may be arranged on the element deposition structure 3000 or the lower substrate layer 1000, or one separating layer 1300 may include a plurality of sub-separating layers. A description is made hereinafter of the separating layer 1300 arranged on the lower substrate layer 1000 or the element deposition structure 3000 according to another embodiment.

Figure 19:
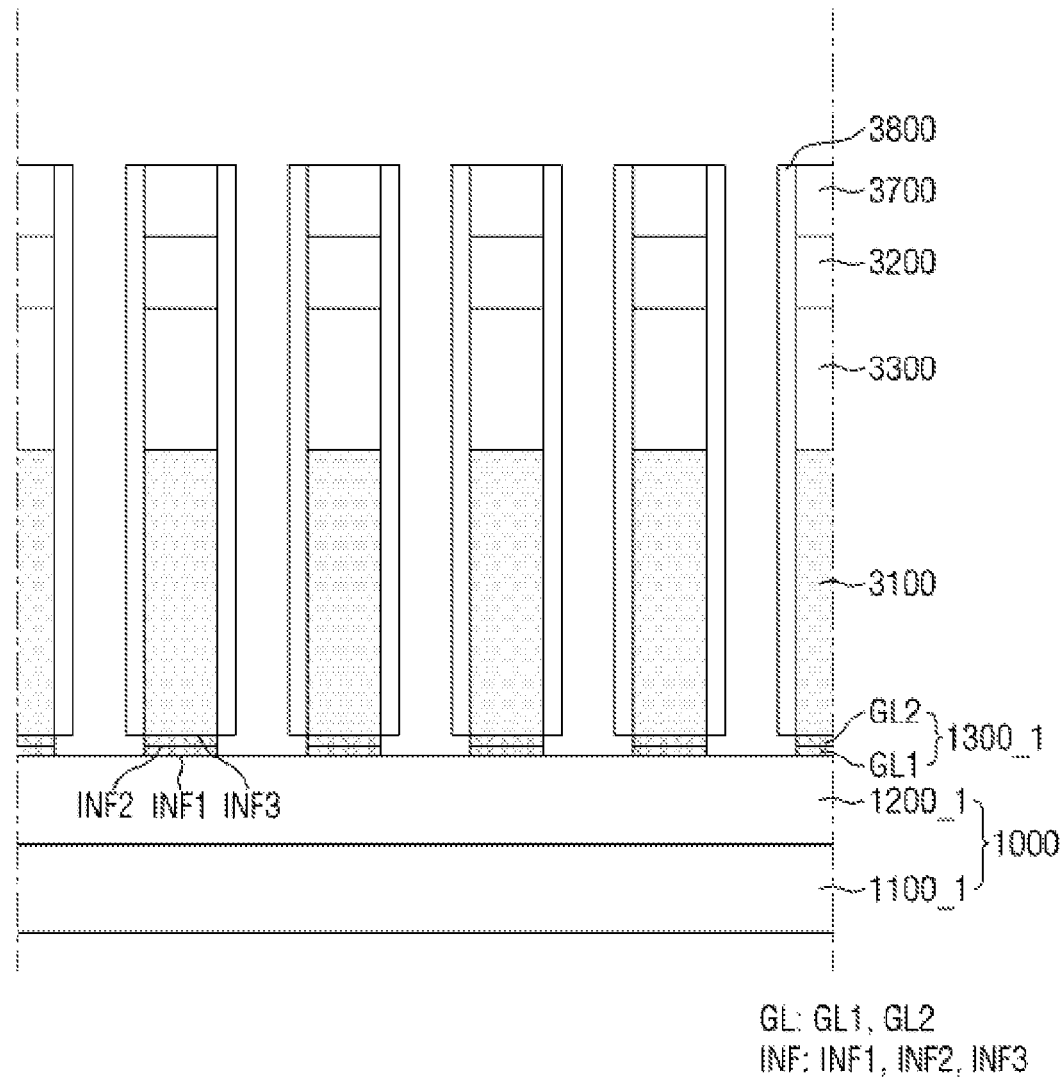
FIGS. 19 to 24 are cross-sectional views schematically illustrating part of a manufacturing method of a light emitting element according to another embodiment.
Figure 20:
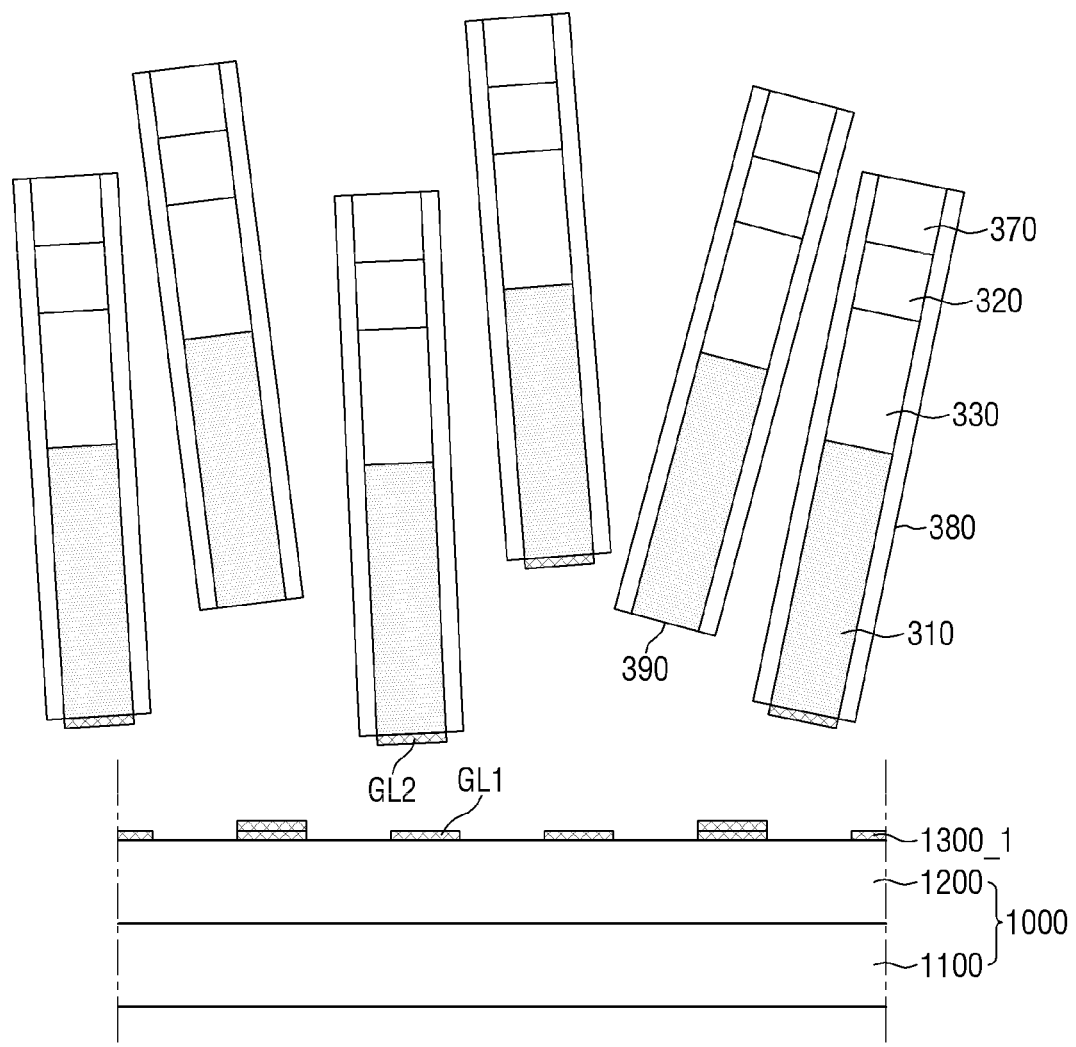

FIG. 19 is a cross-sectional view schematically illustrating a structure of a separating layer according to another embodiment. FIG. 20 is a schematic view illustrating a process for separating light emitting elements by the separating layer of FIG. 19.

With reference to FIG. 19, a separating layer 1300_1 may include a plurality of graphene layers GL. The plurality of graphene layers GL may include a first graphene layer GL1 formed on and contacting a buffer material layer 1200_1 and a second graphene layer GL2 arranged on the first graphene layer GL1 and contacting the parting surface 390 of the light emitting elements 300. The method for manufacturing the light emitting elements is identical with that described with reference to FIGS. 6 to 18, with the exception that the separating layer 1300_1 includes a plurality of graphene layers GL. Hereinafter, a description is made of the method for separating the separating layer 1300_1 and the light emitting elements 300 from each other in detail.

With reference to FIG. 20, when the light emitting elements 300 grown on the separating layer 1300_1 are separated, the separation may respectively occur on a first interface INF1 between a buffer material layer 1200_1 and the first graphene layer GL1, a second interface INF2 between the first graphene layer GL1 and the second graphene layer GL2, and a third interface INF3 between the second graphene layer GL2 and the parting surface 390 of the light emitting elements 300.

By adjusting the interface attractive force on the first interface INF1 between the buffer material layer 1200_1 and the first graphene layer GL1 as described above, the first graphene layer GL1 may remain on the buffer material layer 1200_1 after the light emitting elements 300 are separated. That is, the light emitting elements 300 may be separated from the lower substrate layer 1000_1 by a split at the second interface INF2 or the third interface INF3, where the attractive force is weak.

Here, in the case where the attractive force at the second interface INF2 is greater than the attractive force at the third interface INF3, the separated light emitting elements 300 may expose the first conductivity type semiconductor 310, i.e., the parting surface 390, as shown in FIG. 20. In contrast, if the attractive force at the third interface INF3 is greater than the attractive force at the second interface INF2, the separated light emitting elements 300 may not expose the first conductivity type semiconductor 310 because the second graphene layer GL2 partially remains on the parting surface 390. In this case, the second graphene layer GL2 including graphene having conductivity may form the electrode material layer 370 at one end of the light emitting element 300.

Meanwhile, in some embodiments, it may also be included to remove impurities from the parting surface 390 of the separated light emitting elements 300. As described above, in the case where the separating layer 1300_1 includes the plurality of graphene layers GL, the layered structure on the parting surface 390 of the light emitting elements 300 may vary according to the attractive forces at the plurality of interfaces INF. However, in the case where the attractive forces of the interfaces INF are not accurately controlled, the uniformity of the parting surface 390 of the light emitting elements 300 may decrease and, in order to overcome this, a post-processing process may be performed on the separated light emitting element 300.

As shown in FIG. 20, in order to remove the separating layer 1300_1, e.g., the second graphene layer GL2, remaining on the parting surface 390 of the separated light emitting element 300, the above-described separation process may be repetitively performed. Because the attractive force at the interface between second graphene layer GL2 of the separating layer 1300_1 and the parting surface 390 of the light emitting element 300 is relatively weak, the second graphene layer GL2 may be removed by repeating the process described with reference to FIGS. 18 to 20.

FIGS. 21 to 24 are cross-sectional views schematically illustrating arrangement of a separating layer in an element deposition structure according to still another embodiment.

The separating layer 1300 may be arranged in the first conductivity type semiconductor layer 3100 of the element deposition structure 3000 and, in some cases, directly on the base substrate 1100 with the omission of the buffer material layer 1200.

Figure 21:
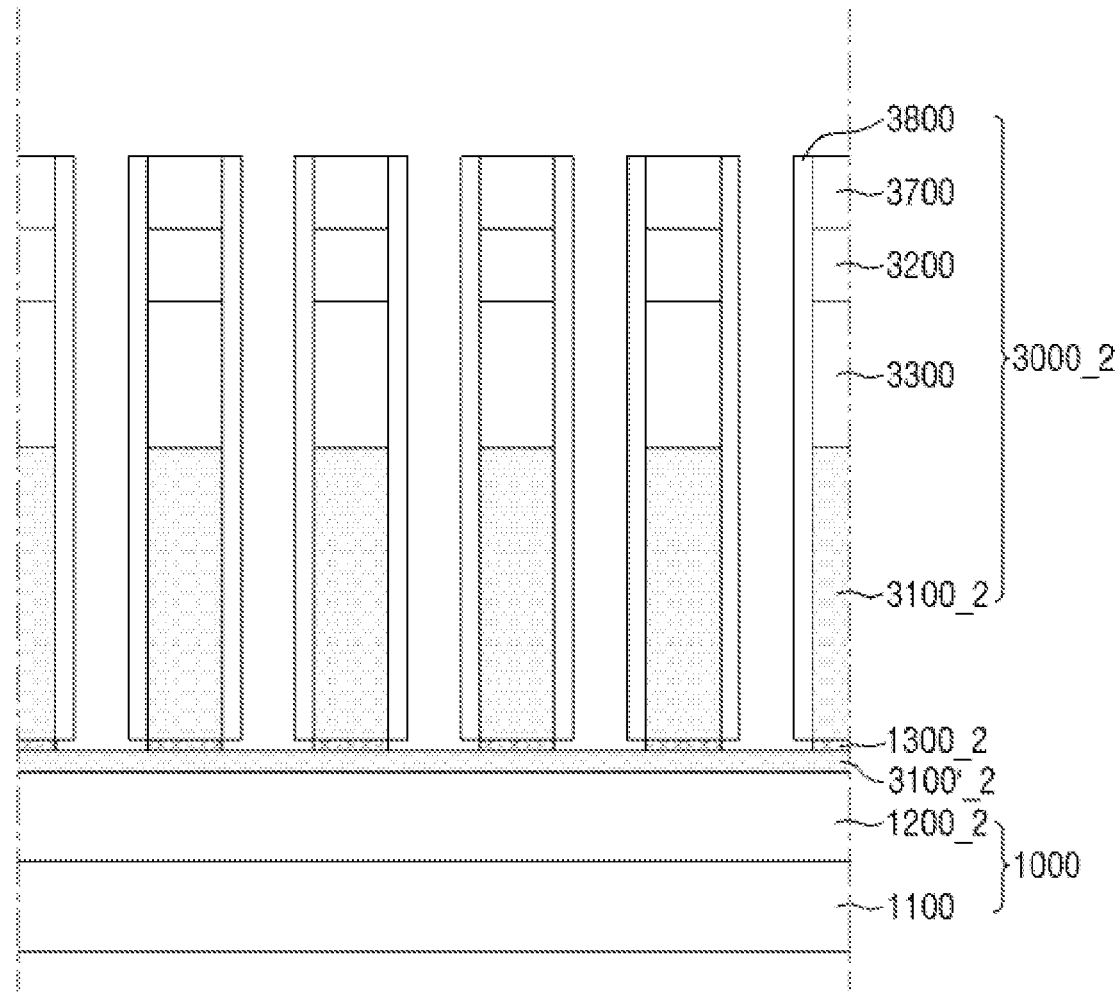

With reference to FIG. 21, the separating layer 1300_2 may be arranged on a first sub-conductivity type semiconductor layer 3100'_2 deposited on a buffer material layer 1200_2, and a first conductivity type semiconductor layer 3100_2 may be deposited on the separating layer 1300_2. The first sub-conductivity type semiconductor layer 3100'_2 may include a material substantially identical with that of the first conductivity type semiconductor layer 3100_2. That is, the separating layer 1300_2 may be arranged in the first conductivity type semiconductor layer 3100_2.

As described above, the buffer material layer 1200 may provide a seed crystal of the first conductivity type semiconductor layer 3100 growing on the separating layer 1300, and may reduce the grid constant of the interfaces. The element deposition structure of FIG. 21 may facilitate crystal growth of the first conductivity type semiconductor layer 3100_2 by substantially including the separating layer 1300_2 in the first conductivity type semiconductor layer 3100_2.

Figure 22:
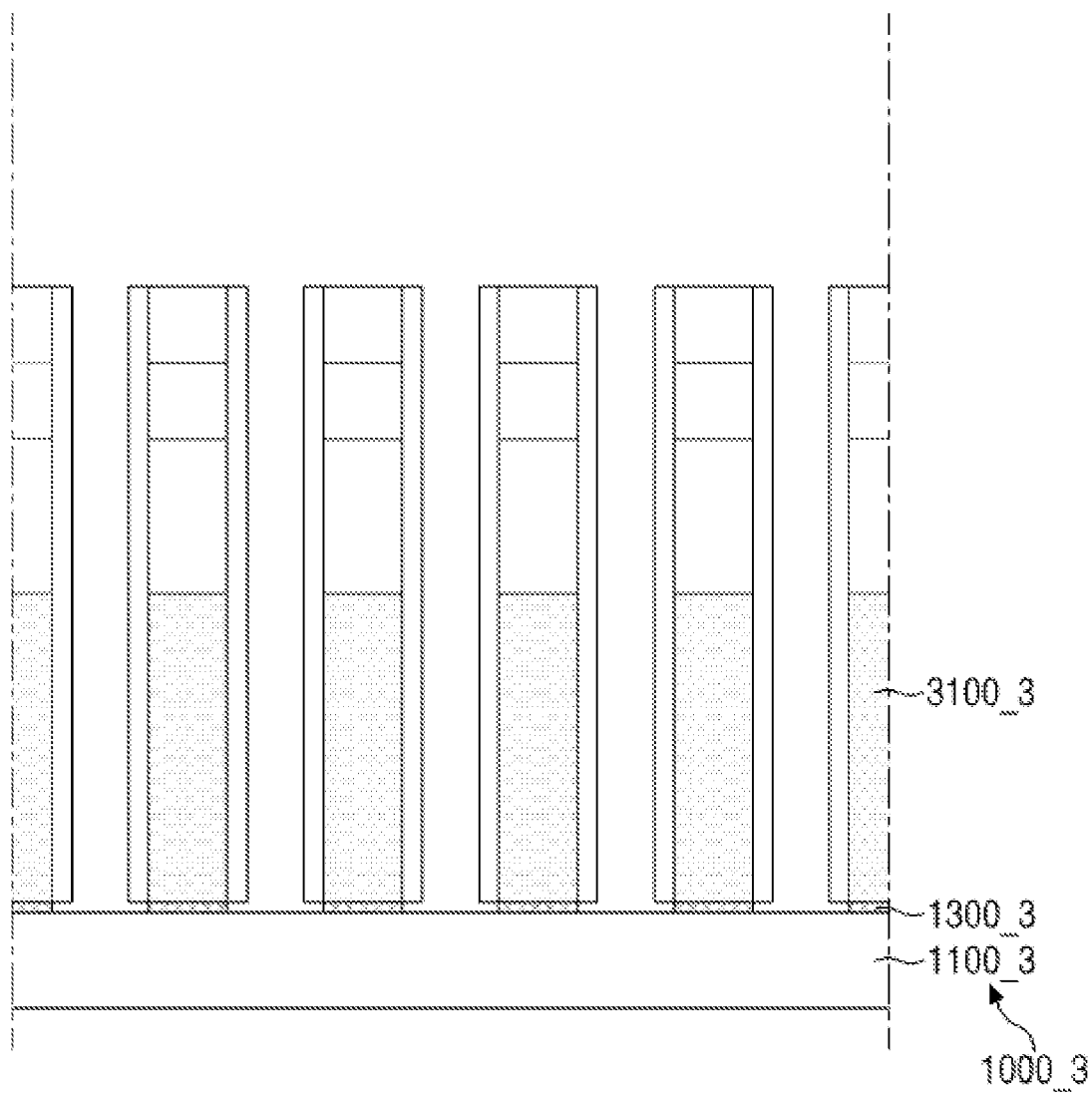

With reference to FIG. 22, in the case where the base substrate 1100_3 includes a material substantially identical with that of the first conductivity type semiconductor layer 3100_3, the buffer material layer 1200 may be omitted, and the separating layer 1300_3 may be directly arranged on the base substrate 1100_3.

For example, in the case where the first conductivity type semiconductor layer 3100_3 includes n-type doped gallium nitride (GaN), and the base substrate 1100_3 is a GaN substrate, the grid constant difference between the base substrate 1100_3 and the first conductivity type semiconductor layer 3100_3 may be small. In this case, even though the buffer material layer 1200 is omitted, the grid constant difference between the base substrate 1100_3 and the first conductivity type semiconductor layer 3100_3 may be small, and the GaN substrate may provide the seed crystal. According to an embodiment, in the process of manufacturing the light emitting elements 300, the separating layer 1300_3 may be directly arranged on the base substrate 1100_3, and the first conductivity type semiconductor layer 3100_3 may grow on the separating layer 1300_3.

Meanwhile, it may be possible to include one or more separating layers that are arranged on different layers in the element deposition structure 3000 and the lower substrate layer 1000.

Figure 23:
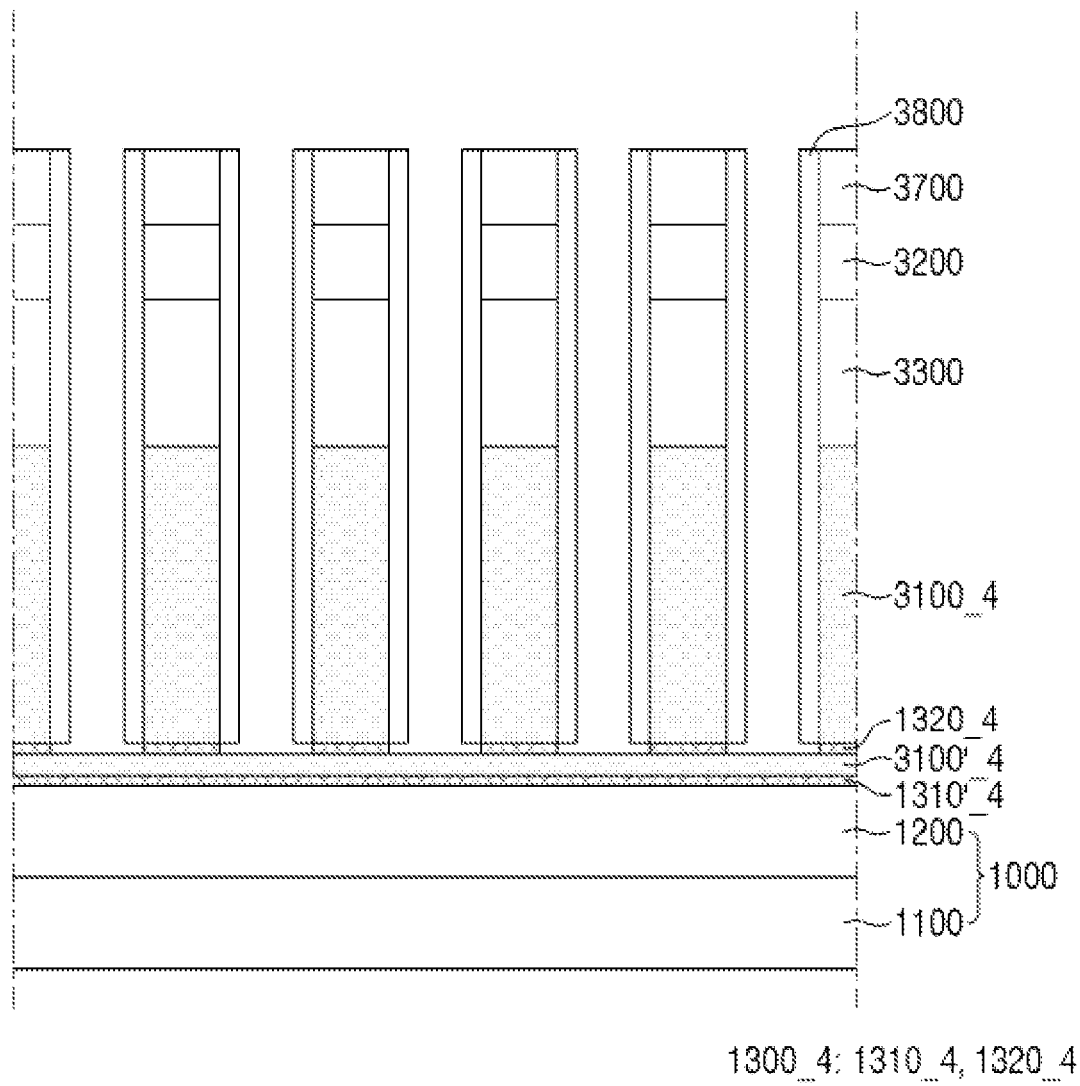

With reference to FIG. 23, the separating layer may include a first sub-separating layer 1310_4 arranged between the buffer material layer 1200_4 and the first sub-conductivity type semiconductor layer 3100'_4, and a second sub-separating layer 1320_4 arranged between the first sub-conductivity type semiconductor layer 3100'_4 and the first conductivity type semiconductor layer 3100_4. That is, in FIG. 23, it may be the case that the second sub-separating layer 1320_4 is further arranged in the first conductivity type semiconductor layer 3100_4 in comparison with the element deposition structure 3000 of FIG. 7.

In this case, if the manufactured light emitting elements 300 are separated, the second sub-separating layer 1320_4 remains on the first sub-conductivity type semiconductor layer 3100'_4. The element deposition structure may be manufactured by removing the second sub-separating layer 1320_4 remaining on the first sub-conductivity type semiconductor layer 3100'_4 and then forming the second sub-separating layer 1320_4 again. That is, it may be possible to use the first sub-conductivity type semiconductor layer 3100'_4 providing the seed crystal of the first conductivity type semiconductor layer 3100_4 repetitively several times.

Figure 24:
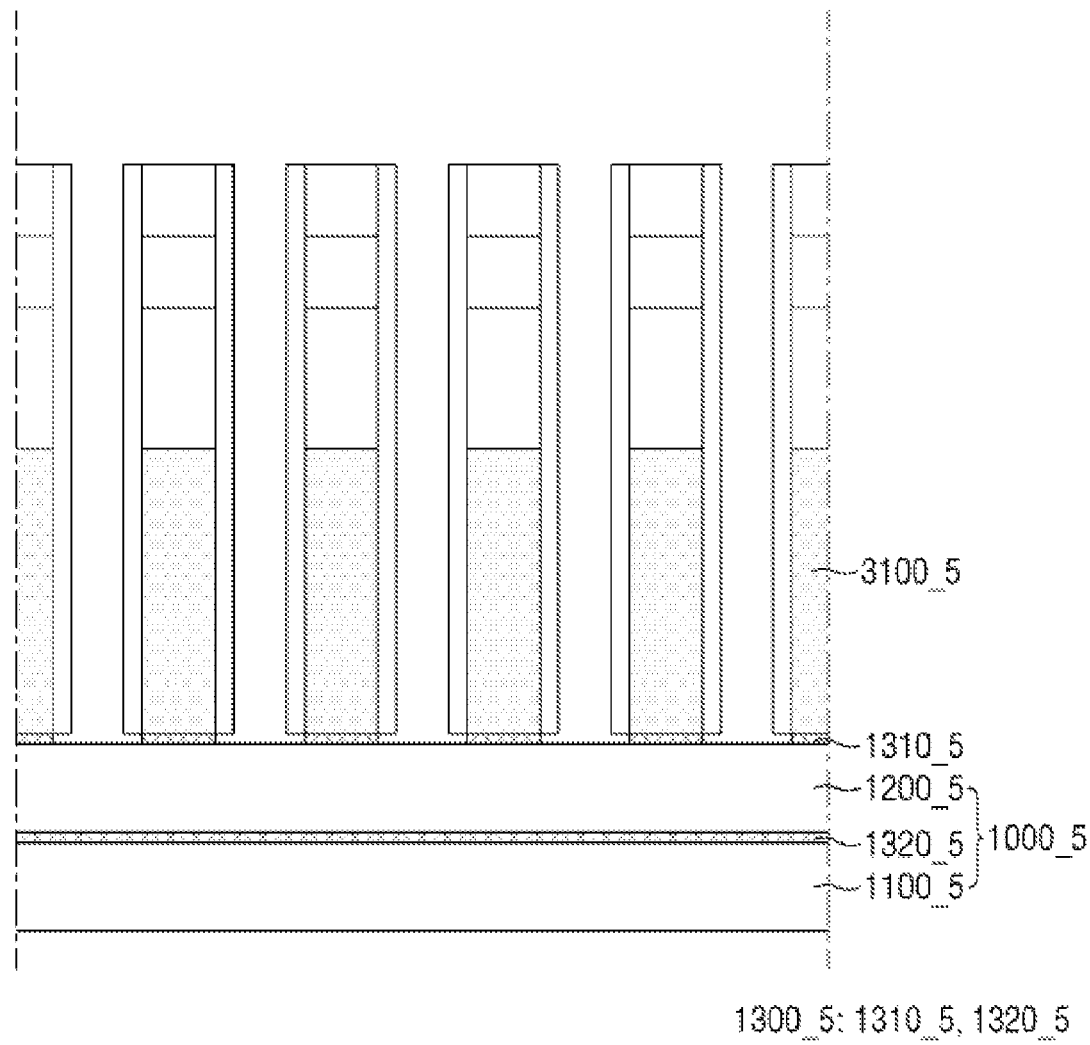

Furthermore, with reference to FIG. 24, the first sub-separating layer 1310_5 may be arranged between the buffer material layer 1200_5 and the first conductivity type semiconductor layer 3100_5, and the second sub-separating layer 1320_5 may be arranged between the base substrate 1100_5 and the buffer material layer 1200_5. That is, in FIG. 24, it may be the case that the second sub-separating layer 1320_5 is further arranged between the base substrate 1100_5 and the buffer material layer 1200_5 in comparison with the lower substrate layer 1000 of FIG. 7.

As described above, the separating layer including graphene has a weak interface attractive force with a certain surface, which facilitates separation or peeling off. In FIG. 24, the first sub-separating layer 1310_5 may serve to separate the light emitting elements 300 from the lower substrate layer 1000_5, and the second sub-separating layer 1320_5 may serve to separate the base substrate 1100_5 and the buffer material layer 1200_5 from each other. In the case where the interface attractive force between the second sub-separating layer 1320_5 and the base substrate 1100_5 is stronger than the interface attractive force between the second sub-separating layer 1320_5 and the buffer material layer 1200_5, the base substrate 1100_5 and the buffer material layer 1200_5 may be easily separated from each other. In this case, after the light emitting elements 300 are manufactured, the base substrate 1100_5 of the lower substrate layer 1000_5 may be reused by separating the buffer material layer 1200_5 therefrom. For example, if the base substrate 1100_5 is a high-priced substrate such as SiC substrate, reusing the base substrate 1100_5 may make it possible to reduce the manufacturing costs of the light emitting elements 300.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:

1. A manufacturing method of a light emitting element, the method comprising:
    preparing a lower substrate comprising a substrate and a buffer material layer on the substrate;
    forming a separating layer on the lower substrate, the separating layer comprising at least one graphene layer;
    forming an element deposition structure by depositing a first conductivity type semiconductor layer, an active material layer, and a second conductivity type semiconductor layer on the separating layer;
    forming an element rod by etching the element deposition structure and the separating layer in a vertical direction; and
    separating the element rod from the lower substrate to form a light emitting element,
    wherein in the forming of the element rod, the separating layer is etched and patterned, and
    the separating the element rod from the lower substrate comprises:
    dipping the lower substrate and the element rod formed on the separating layer into a separation solution, and
    separating the element rod from the lower substrate by applying a vibration to the separation solution,
    wherein at least a portion of the separating layer remains on the lower substrate.

2. The manufacturing method of claim 1, wherein an interface attractive force between the separating layer and the lower substrate at a first interface between the separating layer and the lower substrate is greater than an interface attractive force between the separating layer and the element rod at a second interface between the separating layer and the element rod.

3. The manufacturing method of claim 2, wherein in the forming of the light emitting element, the separating layer at the second interface is peeled off, but the separating layer at the first interface is not peeled off, and the patterned separating layer remains on the lower substrate.

4. The manufacturing method of claim 3, wherein a parting surface of the light emitting element, where the element rod is peeled off at the second interface, is substantially flat and parallel to a top surface of the second conductivity type semiconductor layer.

5. The manufacturing method of claim 4, wherein, in the light emitting element, the parting surface has a mean surface roughness in a range of about 8 nm to about 12 nm.

6. The manufacturing method of claim 5, wherein the forming of the element rod further comprises forming an insulating layer to surround a side surface of the element rod, and
    the light emitting element further comprises the insulating layer to surround side surfaces of the first conductivity type semiconductor layer, the active material layer, and the second conductivity type semiconductor layer.

7. The manufacturing method of claim 1, wherein the separating layer comprises a first graphene layer; and a second graphene layer on the first graphene layer,
    the first graphene layer forms a third interface with the buffer material layer,
    the second graphene layer forms a fifth interface with the element rod, and
    the first graphene layer and the second graphene layer form a fourth interface.

8. The manufacturing method of claim 7, wherein in the forming of the light emitting element,
    the first graphene layer at the third interface is not peeled off,
    at least a portion of the second graphene layer at each of the fourth interface and the fifth interface is peeled off,
    the first graphene layer remains on the lower substrate, and
    the second graphene layer remains on the first graphene layer at the fourth interface, or on the element rod at the fifth interface.

9. The manufacturing method of claim 8, wherein the separating layer comprises a first sub-separating layer on the lower substrate; and
    a second sub-separating layer between the substrate and the buffer material layer.

10. The manufacturing method of claim 1, wherein the element deposition structure further comprises an electrode material layer on the second conductivity type semiconductor layer.

11. The manufacturing method of claim 10, wherein the forming of the element rod comprises forming an etching mask layer on the element deposition structure, and an etching pattern layer comprising one or more nanopatterns separated from each other on the etching mask layer;
    forming a hole by vertically etching an area between adjacent separated one or more nanopatterns; and
    removing the etching mask layer and the etching pattern layer.

12. The manufacturing method of claim 11, wherein the element deposition structure and the separating layer comprise materials different in etch selectivity, and
    the forming of the hole comprises vertically etching the element deposition structure to expose at least a portion of the separating layer overlapping the area between adjacent separated one or more nanopatterns; and
    etching and patterning the exposed portion of the separating layer.

13. The manufacturing method of claim 12, wherein in the vertically etching of the element deposition structure, an etchant comprises chlorine gas ($Cl_2$) and oxygen gas ($O_2$), and
    the separating layer and element deposition structure are etched concurrently.

* * * * *